(12) United States Patent
Sugiyama et al.

(10) Patent No.: US 7,244,499 B2
(45) Date of Patent: Jul. 17, 2007

(54) BONDED STRUCTURE INCLUDING A CARBON NANOTUBE

(75) Inventors: Yukihiro Sugiyama, Gifu (JP); Yasuhiro Oue, Ibaraki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/751,524

(22) Filed: Jan. 6, 2004

(65) Prior Publication Data

US 2004/0142172 A1  Jul. 22, 2004

(30) Foreign Application Priority Data

| Jan. 10, 2003 | (JP) | ............................. 2003-004970 |
| Jan. 10, 2003 | (JP) | ............................. 2003-004971 |
| Dec. 24, 2003 | (JP) | ............................. 2003-428385 |
| Dec. 24, 2003 | (JP) | ............................. 2003-428402 |

(51) Int. Cl.
*B32B 5/16* (2006.01)

(52) U.S. Cl. ...................... 428/407; 977/745; 977/746; 977/748

(58) Field of Classification Search ................ 428/407; 977/745, 746, 748
See application file for complete search history.

(56) References Cited

U.S. PATENT DOCUMENTS

| 6,762,237 B2* | 7/2004 | Glatkowski et al. ......... 524/496 |
| 6,821,730 B2* | 11/2004 | Hannah ............................ 435/6 |
| 6,841,139 B2* | 1/2005 | Margrave et al. ........ 423/447.1 |
| 6,890,654 B2* | 5/2005 | Stupp et al. ................. 428/403 |
| 6,896,864 B2* | 5/2005 | Clarke ...................... 423/447.1 |
| 2002/0068170 A1* | 6/2002 | Smalley et al. ............. 428/403 |

FOREIGN PATENT DOCUMENTS

| EP | 0 949 199 A | * 10/1999 |
| JP | 09-69630 | 3/1997 |
| JP | P2001-77346 | 3/2001 |
| JP | P2002-118248 | 4/2002 |
| WO | WO 02/16257 A | 2/2002 |

OTHER PUBLICATIONS

Dagani, "Sticking things to carbon nanotubes", C&EN, vol. 79, No. 19, p. 15, 2001.*
Odegard et al, "Constitutive Modeling of Nanotube-Reinforced Polymer Composites", American Institute of Aeronautics & Astronautics, 2002.*

(Continued)

*Primary Examiner*—H. Thi Le
(74) *Attorney, Agent, or Firm*—McDermott Will & Emery LLP

(57) ABSTRACT

A technique of stably bonding a structure including a carbon nanotube with another structure is to be provided. Also, a nano-device that offers excellent performance and high production efficiency is to be provided.

A polymer and a carbon nanotube are dispersed in a dispersion medium and on a filled liquid in a Langmuir trough, to obtain a carbon nanotube-based structure constituted of a carbon nanotube and the polymer wound around its rounded surface. The carbon nanotube-based structure is adhered to a substrate, and a ligand is immobilized on a side chain of the polymer. A receptor is immobilized on another carbon nanotube-based structure, and the both carbon nanotube-based structures are joined because of a specific interaction between the ligand and the receptor.

6 Claims, 22 Drawing Sheets

OTHER PUBLICATIONS

O'Connell, "Reversible water-solubilization of single-walled carbon nanotubes by polymer wrapping", Chemical Physics Letters, 342 (2001) 265-271.*

"Methods in Enzymology", 31, a, pp. 667-678 (1974), vol. XXXI.
Japanese Office Action for Corresponding Japanese Patent Application No. 2003-428402, dispatched Mar. 28, 2006.

* cited by examiner

FIG.2D          KEPT STATIC

FIG.8A
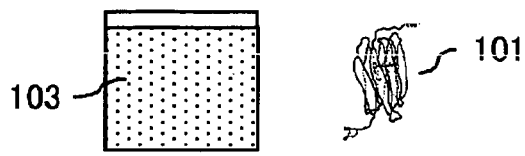
FIG.8B
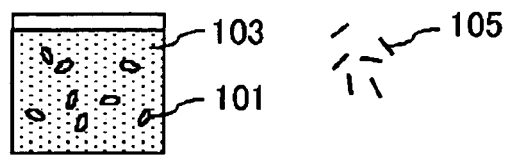
FIG.8C
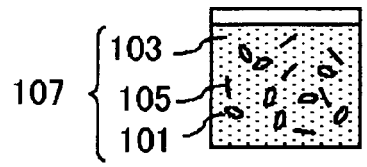
FIG.8D
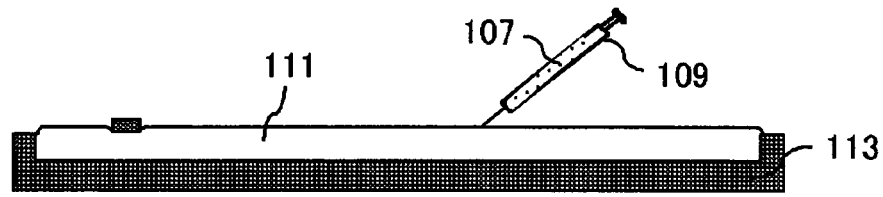
FIG.8E
KEPT STATIC:DENATURATION OF PROTEIN
DUE TO INTERFACIAL TENSION
FIG.8F
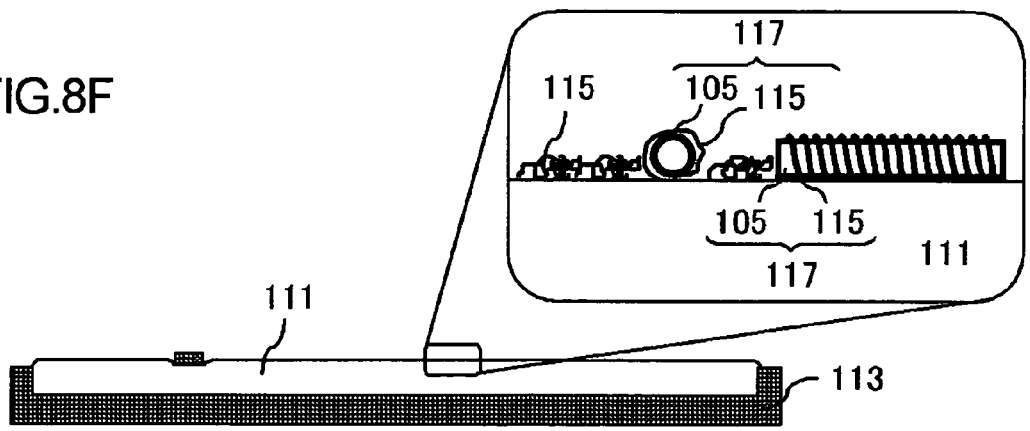

← 604 nm →

5nm

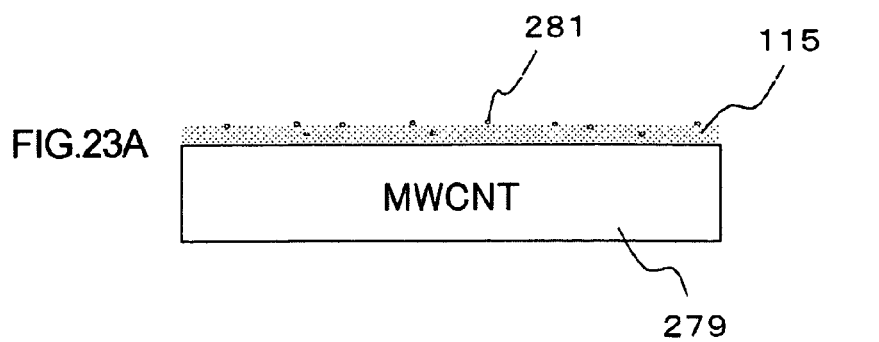
FIG.23A
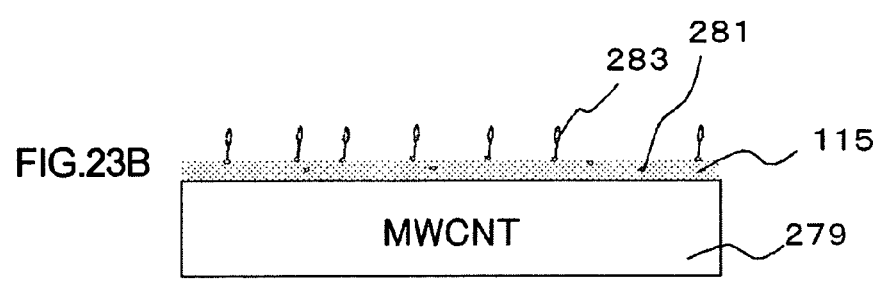
FIG.23B
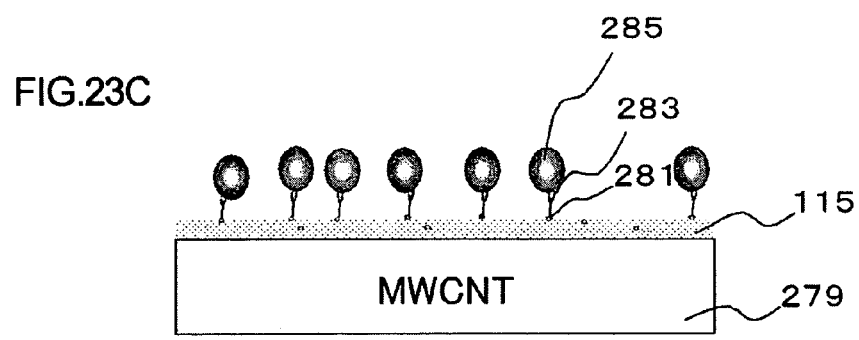
FIG.23C
FIG.24
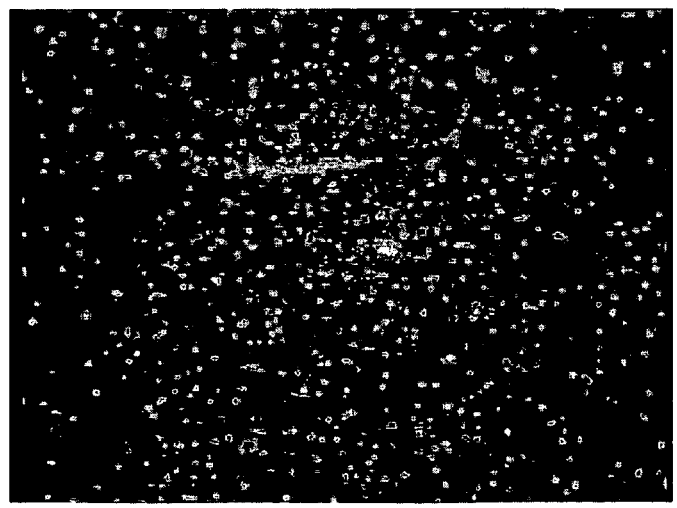

ved with a carbon nanotube, and to an interconnection, a
BONDED STRUCTURE INCLUDING A CARBON NANOTUBE This application is based on Japanese patent applications No. 2003-4970, No. 2003-4971, No. 2003-428385, and No. 2003-428402, the content of which is incorporated hereinto by reference.

BACKGROUND OF THE INVENTION

1. Field of the Invention

The present invention relates to a bonded structure provided with a carbon nanotube, and to an interconnection, a single electron transistor and a capacitor in which a carbon nanotube is incorporated.

2. Description of the Related Art

Recently, nano-devices have been very actively developed based on the so-called nano-processing technique. A nano-device can be operated merely by several electrons, therefore power consumption can be significantly reduced in comparison with a conventional silicon-based device, besides an element size can be dramatically diminished.

For the development of such nano-device, introduction of a carbon nanotube is being intensively studied. A carbon nanotube is constituted of cylindrically connected graphite sheets. A carbon nanotube can be selectively made up into materials having properties that are typical of various products ranging from a semiconductor to a metal through a control of chirality etc. without doping impurities, therefore offers a vast potentiality as a constituent of an integrated circuit including a nano-device. The JP-A (laid open) No. 2002-118248 discloses an electronic device in which a carbon nanotube is incorporated.

For manufacturing such nano-device a high-level refined processing technique is required for integrating various elements on a substrate as well as connecting those elements via refined interconnections.

However a rounded surface of a carbon nanotube has a stable hexagonal ring structure which is not chemically active in general, so it is difficult to join a carbon nanotube to an interconnection, a pad or another element.

Also, when it comes to designing a quantum-effect nano-device in which a quantum effect of a single electron transistor etc. is utilized, the requirement for the refined processing technique is more severe. For instance, in designing a single electron transistor, it is essential to form an ultra-thin insulating film that permits formation of a tunnel barrier between a source/drain electrode and a Coulomb island. If the insulating film is too thick the electron cannot pass through the insulating film, while if it is too thin the electron can freely pass by. Further, in order to prominently obtain unique characteristics originating from the quantum effect, the Coulomb island has to be as small as for example 50 nm or smaller. Studies on the single electron transistor have so far been aggressively performed as observed in the JP-A (laid open) No. 2001-77346 and JP-A (laid open) H9-69630, however nearly none of those studies have successfully achieved a high-level control of a size of a tunnel layer or a Coulomb island, to thereby make full use of the characteristics obtainable from the quantum effect.

SUMMARY OF THE INVENTION

The present invention has been conceived in view of the foregoing background, with an object to provide a technique of stably bonding a structure including a carbon nanotube with another structure.

It is another object of the present invention to provide a nano-device that offers excellent performance and high production efficiency. Also, it is still another object of the present invention to provide an ultrafine interconnection necessary for constituting an integrated circuit composed of nano-devices.

According to the present invention, there is provided a bonded structure comprising a first structure which is a carbon nanotube-based structure including a carbon nanotube and a polymer wrapping a rounded surface thereof; and a second structure bonded with the carbon nanotube-based structure.

In the present invention, "wrapping" a rounded surface of the carbon nanotube means that the polymer covers the carbon nanotube so that a predetermined region of a rounded surface thereof is not exposed. For the wrapping purpose, the polymer may for example be wound around a rounded surface of the carbon nanotube. Otherwise, the polymer may be layered over a rounded surface of the carbon nanotube, i.e. a wrapping layer may be formed.

In the present invention, the state that the polymer is "wound around" a rounded surface of the carbon nanotube refers to such a state that the molecular chain of the polymer is wound around a rounded surface thereof. Also, in the present invention the "wrapping layer" stands for a closely constituted covering formed all over a prescribed region on a rounded surface of the carbon nanotube.

Hereinafter, the term of "wrapping" will imply both of the winding and the wrapping layer.

According to the present invention, there is provided a bonded structure comprising a first structure which is a carbon nanotube-based structure including a carbon nanotube and a polymer layer wrapping a rounded surface of the carbon nanotube; and a second structure bonded with the carbon nanotube-based structure.

The bonded structure according to the present invention is constituted of a first structure which is a carbon nanotube-based structure bonded with a second structure which is other than the carbon nanotube-based structure. In the present invention, since the carbon nanotube-based structure is provided with a polymer layer wrapping a rounded surface of the carbon nanotube, it becomes possible to provide the carbon nanotube with new surface characteristics according to characteristics of the polymer. Also, since the polymer wraps a rounded surface of the carbon nanotube in layers, the rounded surface of the individual carbon nanotubes is securely wrapped. Accordingly, it becomes possible to control a thickness, characteristics such as electric resistance, a shape and characteristics of a surface etc. of the wrapping according to a constitution of the polymer to be used for wrapping. Since the bonded structure of the present invention is constituted of such carbon nanotube-based structure bonded with another structure, applicability of the carbon nanotube can be further expanded. For example, the bonded structure can be suitably used for a nano-device.

According to the present invention, there is provided a bonded structure comprising a first structure which is a carbon nanotube-based structure including a carbon nanotube and a polymer wound around a rounded surface of the carbon nanotube; and a second structure bonded with the carbon nanotube-based structure.

In the bonded structure according to the present invention, a carbon nanotube-based structure in which a polymer is wound around a rounded surface of the carbon nanotube is employed. The carbon nanotube-based structure of such constitution can stably maintain the wrapping state of the polymer on a surface of the carbon nanotube. Also, since a rounded surface of the individual carbon nanotubes is securely wrapped with the polymer wound around the carbon nanotube, it becomes possible to control a thickness, characteristics such as electric resistance, a shape and characteristics of a surface etc. of the wrapping according to a constitution of the polymer to be used for wrapping. The bonded structure of the present invention, because of being constituted of such carbon nanotube-based structure bonded with another structure, can be suitably used for a nanodevice.

In the present invention, the polymer may be directly wrapped on a rounded surface of the carbon nanotube. Such constitution further assures the wrapping effect. Consequently, stability of the product quality can be improved.

Further, the wrapped region on a rounded surface of the carbon nanotube may occupy a part of the rounded surface or an entirety thereof.

In the bonded structure of the present invention, among various modes that can be employed for bonding the carbon nanotube-based structure with the second structure, the structures may be bonded via the polymer.

The bonded structure of the present invention may further comprise a bonding material between the polymer and the second structure to be bonded therewith. As a result, the carbon nanotube and the second structure are more securely bonded. Also, a bonding position of the polymer and the second structure can be controlled by selecting a position to provide the bonding material.

In the bonded structure of the present invention, the bonding material may comprise a set of molecules with a specific interaction. By introducing a set of molecules with a specific interaction, a joint position can be more precisely controlled. Further, through selection of various combinations of molecules, it becomes possible to form a bonded structure of a complicated constitution including a branch.

In the bonded structure of the present invention, the set of molecules with a specific interaction may include a combination of a ligand and a receptor, or a combination of an antigen and an antibody.

In the bonded structure of the present invention, the second structure may be one according to the present invention or a material other than a structure according to the present invention.

In the bonded structure of the present invention, the second structure may be a base member. Such bonded structure can be applied to an integrated circuit including a carbon nanotube-based structure formed on a substrate, and the like.

In the bonded structure of the present invention, the second structure may be a metal film. Such bonded structure can be applied to a structure constituted of a carbon nanotube-based structure fixed to a metal electrode or a metal pad. In this case, it is effective to introduce a specific functional group or a specific molecule that specifically adsorbs or binds with the metal film into the polymer for bonding. Through this method the carbon nanotube-based structure and the second structure can be easily and securely bonded.

In the bonded structure of the present invention, the second structure may comprise a carbon nanotube. Such bonded structure can be suitably applied to an interconnection constituted of a plurality of carbon nanotube-based structures connected or joined to one another.

In this bonded structure, the carbon nanotube included in the second structure bonded with the carbon nanotube-based structure may comprise a layer constituted of a polymer wrapping a rounded surface thereof.

Also, in this bonded structure the carbon nanotube included in the second structure bonded with the carbon nanotube-based structure may include a polymer wound around a rounded surface thereof. As a result, it becomes possible to stably form a bonded structure constituted of carbon nanotube-based structures connected or joined to each other at the respective rounded surfaces thereof.

According to the present invention, there is provided an interconnection comprising a plurality of carbon nanotube-based structures joined to one another respectively including a carbon nanotube and a polymer layer wrapping a rounded surface thereof.

In this interconnection, the layered polymer wrapping a rounded surface of the carbon nanotube serves as a coating material for the interconnection.

Also, according to the present invention, there is provided an interconnection comprising a plurality of carbon nanotube-based structures joined to one another individually including a carbon nanotube and a polymer wound around a rounded surface thereof.

In this interconnection, the polymer wound around a rounded surface of the carbon nanotube serves as a coating material for the interconnection.

In the interconnection according to the present invention, each of the carbon nanotube-based structure constitutes an interconnection unit. Among various methods of joining the carbon nanotube-based structures, an example is introducing a specific functional group or binding a specific molecule to the polymer wound around a rounded surface of the carbon nanotube; bonding the carbon nanotube-based structures via the functional group or the molecule; and then molding the bonded portion with a metal material removing a surplus of the polymer from the bonded portion.

For fixing the interconnection of the present invention at a predetermined position on a base member, it is effective to modify or bind a unit (atomic group) or a specific molecule that specifically reacts with a material constituting the fixing position of the interconnection, to the polymer.

Also, according to the present invention, there is provided a single electron transistor comprising a carbon nanotube-based structure including a carbon nanotube and a polymer layer wrapping a rounded surface thereof; a source electrode bonded with the carbon nanotube-based structure via the polymer; a drain electrode bonded with the carbon nanotube-based structure via the polymer; and a gate electrode of applying a voltage to the carbon nanotube.

Further, according to the present invention, there is provided a single electron transistor comprising a carbon nanotube-based structure including a carbon nanotube and a polymer wound around a rounded surface thereof; a source electrode bonded with the carbon nanotube-based structure via the polymer; a drain electrode bonded with the carbon nanotube-based structure via the polymer; and a gate electrode of applying a voltage to the carbon nanotube.

Further, according to the present invention, there is provided a single electron transistor comprising a carbon nanotube-based structure including a carbon nanotube and a polymer layer wrapping a rounded surface thereof; a source electrode and a drain electrode provided via the polymer; and a gate electrode of applying a voltage to the carbon nanotube.

Still further, according to the present invention, there is provided a single electron transistor comprising a carbon nanotube-based structure including a carbon nanotube and a polymer wound around a rounded surface thereof; a source electrode and a drain electrode provided via the polymer; and a gate electrode of applying a voltage to the carbon nanotube.

In such single electron transistor, the polymer serves as a tunnel layer, and the carbon nanotube between the source and drain electrodes as a Coulomb island. According to the present invention, it becomes possible to control a thickness or dimensions of such tunnel layer and Coulomb island at a high precision level, to thereby obtain a single electron transistor that offers excellent performance and high production efficiency.

Now, in a single electron transistor it is especially important to form the two tunnel layers in contact with the Coulomb island in a uniform thickness, so that a resistance value of the tunnel layers becomes substantially equivalent. When a thickness of the tunnel layer is represented by d and a tunnel resistance by R, the following formula is approximately established.

$$R = k \cdot \exp(-d) \quad (k \text{ is a constant})$$

Accordingly, a slight difference in the tunnel thickness results in a large difference in the resistance value, which is why it is critical to precisely control the tunnel thickness. Further, since it is necessary to provide a plurality of transistors having identical characteristics in a design of an integrated circuit, it is required to form the tunnel layers of the plurality of transistors in a uniform thickness, from the viewpoint of minimizing variance in performance level among the transistors as much as possible.

In order to fulfill the foregoing requirement, the present invention has opted to form the tunnel layer with a polymer. By such constitution the tunnel layer thickness is defined by dimensions unique of the polymer employed, therefore variance in tunnel thickness in a single transistor as well as throughout a plurality of transistors can be effectively reduced. As a result, a single electron transistor that offers excellent performance and high production efficiency can be obtained.

Also, according to the present invention, there is provided a capacitor comprising a carbon nanotube-based structure including a carbon nanotube and a polymer layer wrapping a rounded surface thereof; and a conductive member bonded to the polymer directly or via a bonding material.

Further, according to the present invention, there is provided a capacitor comprising a carbon nanotube-based structure including a carbon nanotube and a polymer wound around a rounded surface thereof; and a conductive member bonded to the polymer directly or via a bonding material.

In this capacitor, the polymer wound around a rounded surface of the carbon nanotube serves as a capacitor film. Since a thickness of such capacitor film is defined by dimensions unique of the polymer, a designed capacity value can be obtained with a high reproducibility, and variance in performance level among elements can be effectively minimized.

In the present invention, the term of "polymer" refers to a molecule that has a sufficient skeleton chain length for wrapping a carbon nanotube. Either an organic polymer or an inorganic polymer may be used, though it is more advantageous to employ an organic polymer because various functional groups can be introduced to its side chain, which provides an excellent bonding effect with another structure.

In the present invention, the wrapping layer may be uniformly provided all over the rounded surface of the carbon nanotube. By such constitution, dispersion stability of the carbon nanotube can be further improved. Besides, the wrapping layer can be securely provided on a certain region of a surface of the carbon nanotube. Consequently, it becomes possible to stably manufacture a bonded structure having a desired shape or constitution, or a nano-device provided with such bonded structure.

In the present invention, the carbon nanotube-based structure may be provided with the wrapping layer constituted of the polymer wrapping a rounded surface of the carbon nanotube in a uniform thickness. As a result, variance of surface characteristics of the carbon nanotube-based structure can be reduced.

In the carbon nanotube-based structure of the present invention, the layer may have a thickness of 1 nm to 100 nm both inclusive.

In the present invention, the polymer may be an insulating material. As a result, an insulative wrapping can be provided on a rounded surface of the carbon nanotube.

In the present invention, the polymer may be a biopolymer. As a result, additional surface characteristics can be provided to the carbon nanotube.

In the present invention, the polymer may be water-insoluble. By such constitution, delamination of the polymer layer and intrusion of a water molecule into the carbon nanotube surface can be restrained, so that the carbon nanotube can stably remain in water. Consequently, it becomes possible to stably manufacture a bonded structure having a desired shape or constitution, or a nano-device provided with such bonded structure.

In the bonded structure of the present invention, the polymer may include a polypeptide. A skeleton chain of a polypeptide can be stably wound around the carbon nanotube, to thereby form a stable wrapping layer. Also, it becomes possible to utilize a nature of an amino-acid residue side chain for bonding with a base member, and to provide, based thereon, various surface characteristics to the rounded surface of the carbon nanotube, such as improved dispersion in a solvent.

In the present invention, the polymer may be a denatured protein.

A denatured protein is, unlike a native protein, generally exposing its hydrophobic portion, therefore wrapping a rounded surface of the carbon nanotube with such substance can be more easily and securely executed. Also, by spreading protein dispersion over a liquid surface, the protein can be more efficiently denatured by an interfacial tension at a gas-liquid interface, to thereby expose its hydrophobic portion. Meanwhile, in the present invention the "denaturation" of a protein refers to decay of a native structure of the protein molecule, deactivation of functions, or a conformational change except disconnection of a primary structure constituting the protein molecule, i.e. an amino-acid sequence, and an extent of the conformational change is not specifically determined.

In the present invention, the polymer may be a membrane protein. Since many of the membrane proteins have a hydrophobic region, employing a membrane protein permits efficient adsorption thereof to a rounded surface of the carbon nanotube, to thereby achieve a stable wrapping. Consequently, it becomes possible to stably manufacture a bonded structure having a desired shape or constitution, or a nano-device provided with such bonded structure.

In the present invention, the bonding material may comprise a set of molecules with a specific interaction. By introducing a set of molecules with a specific interaction, a joint position can be more precisely controlled. Here, the "set of molecules with a specific interaction" may include for example a combination of a ligand and a receptor, or a combination of an antigen and an antibody.

BRIEF DESCRIPTION OF THE DRAWINGS

The foregoing and other objects, features and advantages will become more apparent through the following description of the preferred embodiments and the accompanying drawings listed hereunder.

FIGS. 2A to 2E are explanatory drawings of a manufacturing method of a carbon nanotube-based structure according to an embodiment;

FIGS. 8A to 8F are explanatory drawings of a manufacturing method of a carbon nanotube-based structure according to a working example;

FIGS. 23A to 23C are explanatory drawings of avidination steps of a carbon nanotube-based structure transfer surface according to a working example; and FIG. 24 shows a fluorescent microscopic image of an avidinated carbon nanotube-based structure transfer surface according to a working example.

DETAILED DESCRIPTION OF THE INVENTION

Figure 1A:
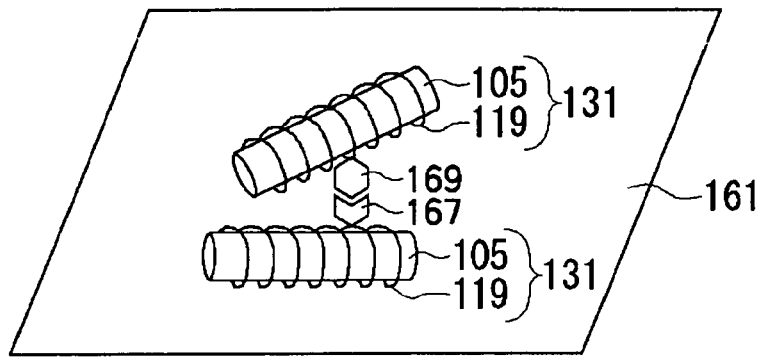
FIGS. 1A to 1D are schematic drawings of a bonded structure according to an embodiment of the present invention.

Hereunder, referring to the accompanying drawings, the embodiments of the present invention will be described in details here below. In all the drawings, constituents that are common to different drawings are given an identical reference numeral, and description thereof may not be given as the case may be.

Firstly, a bonded structure to be used for forming an interconnection or a device according to the present invention will be described based on the first to third embodiments. The bonded structure includes a carbon nanotube-based structure provided with a wrapping at a rounded surface thereof, and such carbon nanotube-based structure is joined to another carbon nanotube, carbon nanotube-based structure or a substrate, etc. at a predetermined position. Secondly, devices according to the present invention will be described based on the fourth and fifth embodiments.

FIRST EMBODIMENT

A bonded structure according to this embodiment includes at least two carbon nanotube-based structures, each constituted of a carbon nanotube with its rounded surface wrapped with a polymer and provided with a receptor or a ligand immobilized as a bonding material on the wrapping on a carbon nanotube-based structure, joined to each other via a specific interaction between the receptor and the ligand.

The carbon nanotube-based structure employed in the bonded structure of this embodiment is constituted of a carbon nanotube and a polymer wrapping a rounded surface thereof. The wrapping may be provided on a certain region of a surface of the carbon nanotube, or uniformly formed all over the rounded surface of the carbon nanotube. Also, the wrapping may be a tight layer closely formed all over a circumferential surface at a certain region on the rounded surface of the carbon nanotube.

In this carbon nanotube-based structure, the polymer may be wound around a rounded surface of the carbon nanotube. In case of forming the wrapping by winding the polymer around the carbon nanotube also, the "layer" referred to in the present invention can be appropriately formed under certain conditions.

The following description is based on such carbon nanotube-based structure provided with a polymer wound around a rounded surface of the carbon nanotube. The carbon nanotube-based structure according to this embodiment is constituted of a carbon nanotube and a polymer wound around a rounded surface thereof.

FIG. 1A is a schematic perspective view showing a constitution of the bonded structure according to this embodiment. The bonded structure is constituted of a carbon nanotube-based structure 131 having a receptor 167 immobilized on a rounded surface thereof and a carbon nanotube-based structure 131 having a ligand 169 immobilized on a rounded surface thereof, joined via a specific interaction between the ligand 169 and the receptor 167. The carbon nanotube-based structure 131 is constituted of the carbon nanotube 105 and a polymer 119 wound around a rounded circumferential surface thereof.

In the carbon nanotube-based structure 131, since the wrapping on the rounded circumferential surface of the carbon nanotube 105 is constituted of the polymer 119 wound around the carbon nanotube 105, a surface shape or thickness of the wrapping is determined mainly depending on a main skeleton construction of the polymer 119. Accordingly, a pitch of up-and-down profile or thickness of the wrapping to be formed on each carbon nanotube 105 can be uniformly adjusted. Besides, variance in the wrapping thickness etc. among a plurality of carbon nanotubes 105 can be restrained. Therefore, such bonded structure can be advantageously employed in a nano-device.

Also, in the bonded structure of FIG. 1A, since the carbon nanotube-based structures 131 are joined to each other via a specific interaction between the receptor 167 and the ligand 169, the joint between the carbon nanotube-based structures 131 can be formed at a desired position according to the design.

The carbon nanotube 105 constituting the carbon nanotube-based structure 131 is to be selectively employed in a desired diameter and length according to the design. For example, a carbon nanotube of 0.4 nm to 100 nm in diameter and 50 nm to 10 ìm in length may be applied. Also, either a single-wall carbon nanotube (SWCNT) or a multi-wall carbon nanotube (MWCNT) may be employed.

A type of the polymer 119 is not specifically limited as long as being constituted of a molecule that can be practically wound around a rounded surface of the carbon nanotube 105 to thereby form a wrapping on a surface of the carbon nanotube 105, and various synthetic polymer or biopolymer may be employed. Meanwhile, it is preferable that the molecule forms a layered wrapping on a rounded surface of the carbon nanotube when wound thereon. Examples of the polymer 119 may include a polyorefin, polyamide, polypeptide, etc. Biopolymers such as protein, DNA and polysaccharide may also be employed. In addition, a water-insoluble polymer can also be used as the polymer 119.

Among the foregoing examples, a polypeptide provides a stable wound structure with high reproducibility. Also, by appropriately selecting a type of amino-acid contained in the molecule, extensive variety of surface characteristics can be provided to the surface of the carbon nanotube 105. In addition, a polypeptide offers high selection freedom of a functional group to be used for joining the carbon nanotube-based structures 131.

Referring to protein, a denatured protein may be employed. Especially, a denatured membrane protein is usually water-insoluble and contains a large portion of hydrophobic amino-acid. And since the membrane protein denatured on a gas-liquid interface is exposing more its hydrophobic portion than that with the native conformation, winding around a rounded surface of the carbon nanotube 105 can be more easily and securely executed. For example, as subsequently described, the protein can be wound around a rounded surface of the carbon nanotube 105 with its hydrophobic portion exposed due to efficient denaturation by an interfacial tension at a gas-liquid interface, caused by spreading protein dispersion over a liquid surface. Further, by wrapping a rounded surface of the carbon nanotube 105 with a denatured protein a layered wrapping can be formed, so that a thin film wrapping can be obtained.

Meanwhile, in the present embodiment the "denaturation" of a protein refers to decay of a native structure of the protein molecule, deactivation of functions, or a conformational change except disconnection of a primary structure constituting the protein molecule, i.e. an amino-acid sequence, and an extent of the conformational change is not specifically determined.

Further, in case of employing a protein as the polymer 119, various membrane proteins such as bacteriorhodopsin may also be used. Since a membrane protein contains a substantial portion of hydrophobic amino-acid, the membrane protein denatured on a gas-liquid interface can be efficiently adsorbed to a rounded surface of the carbon nanotube 105, to be stably wound thereon. Also, the membrane protein can form a tightly wrapped layer on the surface of the carbon nanotube 105. Meanwhile, a skeleton chain length of the polymer 119 can be appropriately selected depending on a length of the carbon nanotube 105 or according to a purpose of use of the carbon nanotube-based structure 131.

Employing a polymer having a hydrophobic skeleton including a hydrophilic group such as a hydroxyl group, carboxyl group etc. at its side chain as the polymer 119 significantly improves dispersibility of the carbon nanotube 105 in water. In this case, since the polymer 119 is wound around the surface of the carbon nanotube 105, the rounded surface of the carbon nanotube 105 can be uniformly wrapped. Also, by changing a side chain of the polymer 119, a joint position with another carbon nanotube 105 can be adjusted as subsequently described.

Referring to the receptor 167 and the ligand 169, various types of ligands and receptors can be employed. It is preferable to combine substances that have a specific interaction, for example an antigen and an antibody, an enzyme and a substrate, a substrate derivative or an inhibitor, etc. A combination of a steroid and its receptor can be cited as a specific example. Further, though FIG. 1A shows a combination of the receptor 167 and the ligand 169, a combination of DNA and DNA, or DNA and RNA etc. can also be employed as the bonding material.

In general, an antibody has two antigen-binding sites. Accordingly, in case where a combination of an antigen and an antibody is substituted for the combination of the receptor 167 and the ligand 169, a branch structure can be formed. For example, a combination of a dinitrophenol (DNP) derivative and an anti-DNP antibody can be adopted.

Also, since an avidin has four biotin-binding sites, utilizing a specific interaction between an avidin and a biotin enables formation of a bonded structure having a more complicated branch structure. By the way, a streptoavidin may be used in place of an avidin. Such branch structure can be either incorporated in a device as it is, or utilized as a temporary binding for assembling a device. In case of utilizing as a temporary binding, it becomes possible to secure electric contact at an intersection after completing the branch structure in a manner subsequently described in the fifth embodiment, to thereby utilize as a branch interconnect structure.

Now referring to FIGS. 2A through 4B, method of manufacturing the bonded structure of FIG. 1A will be described. FIGS. 2A to 2E are explanatory drawings for explaining a manufacturing method of the carbon nanotube-based structure 131. FIGS. 3A to 3D and 4A, 4B are explanatory drawings for explaining a method of joining the carbon nanotube-based structure 131 to the other carbon nanotube-based structure 131 via a ligand and a receptor.

Figure 2A:
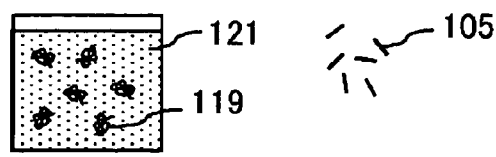
Figure 2B:
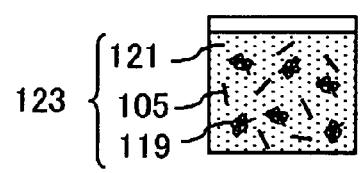

First, the polymer 119 is dispersed in a dispersion medium 121 (FIG. 2A). Then the carbon nanotube 105 is added to the dispersion, to thereby obtain a dispersion 123 (FIG. 2B). For dispersing, for example an ultrasonic disperser may be utilized.

Figure 2C:
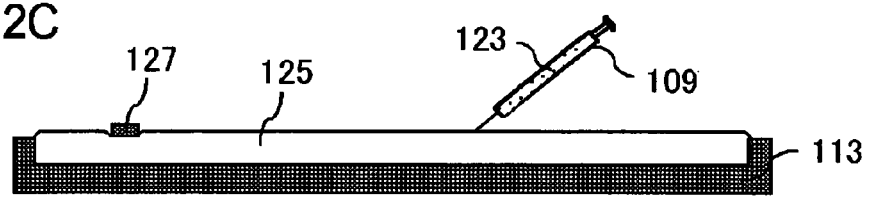

The dispersion 123 thus obtained is spread over a surface of a filled liquid 125 in a bath, with a syringe 109 or the like (FIG. 2C). FIG. 2C shows a Langmuir trough 113 provided with a movable barrier 127 being utilized as the bath.

Figure 2E:
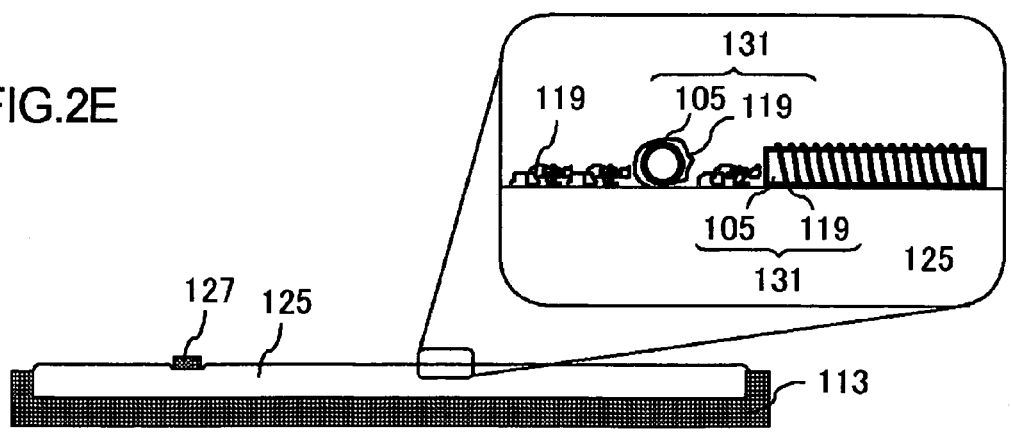

After spreading, the dispersion 123 is left static (FIG. 2D). During this stage, the polymer 119 having a varied conformation winds around a rounded surface of the carbon nanotube 105, so that the carbon nanotube-based structure 131 provided with a wrapping is formed (FIG. 2E).

The carbon nanotube-based structure 131 thus obtained is adhered to a surface of a base member. In this embodiment, the carbon nanotube-based structure 131 on the filled liquid 125 is caused to adhere to a surface of a substrate (not shown) by a horizontal transfer method. The horizontal transfer method includes bringing a substrate into contact with a liquid with the substrate surface oriented parallel to the liquid surface and lifting holizontally the substrate so that the interface film including the carbon nanotube-based structures 131 on the liquid surface transfers to the substrate surface. In this way the carbon nanotube-based structure 131 is disposed on the substrate surface.

Here, the dispersion medium 121 may be appropriately selected out of an organic solvent, or a mixed solution or aqueous solution thereof, which is capable of dispersing the polymer 119 in a sufficiently stable manner. Also, the filled liquid 125 may be appropriately selected according to nature of the dispersion medium 121 and the polymer 119. For example, when using a bacteriorhodopsin as the polymer 119, an aqueous solution of an organic solvent can be preferably used as the dispersion medium 121. Specifically, for example a DMF (dimethylformamide) aqueous solution or DMSO (dimethylsulfoxide) aqueous solution may be employed. Further, as the filled liquid 125 an acid aqueous solution having a pH value of 2 to 6 both inclusive, preferably 3 to 4 both inclusive may be utilized. With such combination, a composite interface film consisting of the carbon nanotubes 105 and bacteriorhodopsins can be formed on the filled liquid 125. During the stage of FIG. 2C, the carbon nanotube-based structures 131 are formed in the composite interface film on the filled liquid 125. Meanwhile, manufacturing method of the carbon nanotube-based structure 131 utilizing bacteriorhodopsins will be described in further details in a subsequent working example.

Further, a predetermined protein other than a bacteriorhodopsin may also be employed. In case of utilizing a protein having a cysteine residue as the polymer 119, a reduction reagent such as a DTT (dithiothreitol) may be added to the dispersion medium 121 or to the filled liquid 125 as the case may be. This will further ensure winding of the polymer 119 around a rounded circumference of the carbon nanotube 105 to form a wrapping.

Also, when producing the carbon nanotube-based structure 131, the step of FIG. 2E may be followed by an additional step of compressing the interface film including the carbon nanotube-based structures 131 on the filled liquid 125 with a partition plate, i.e. the movable barrier 127 of the Langmuir trough. By compressing the interface film including the carbon nanotube-based structure 131 on the filled liquid 125, the carbon nanotube-based structure 131 can be oriented in a certain direction. For example in case where bacteriorhodopsins in a purple membrane are employed as the polymer 119, it is preferable to compress at a compressing speed of approx. 20 $cm^2$/min. until surface pressure becomes approx. 5 mN/m to 25 mN/m. Orientation of the carbon nanotube 105 can be confirmed with an AFM (atomic force microscope), for example. At this stage, out of the polymer 119 i.e. denatured proteins, molecules that have not wound around the carbon nanotube 105 become an aggregation constituted of amorphous region in the interface film monolayers, which aggregation serves as a support for the carbon nanotube-based structure 131 to maintain the orientation status of the carbon nanotube 105.

Further, when compressing the interface film including the carbon nanotube-based structures 131, the greater the surface pressure is, the thicker the layer of the polymer 119 becomes that is wrapped on the rounded surface of the carbon nanotube 105. Accordingly, by appropriately controlling the compressing speed depending on a purpose of the bonded structure, the carbon nanotube-based structure 131 becomes applicable to various types of bonded structures.

Figure 3A:
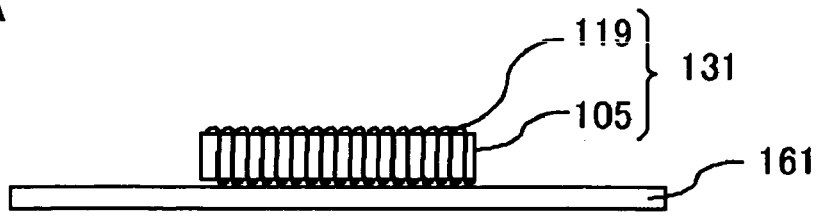
FIGS. 3A to 3D are explanatory cross-sectional drawings of a method of joining a carbon nanotube-based structure to a carbon nanotube via a ligand and a receptor, according to an embodiment.

Now referring to FIGS. 3A through 4B, a method of joining the carbon nanotube-based structure 131 obtained as above and the other carbon nanotube-based structure 131 will be described. FIG. 3A shows the carbon nanotube-based structure 131 adhered to a substrate 161 in the foregoing method. Meanwhile, in case where a metal that can form a carbide exists on a surface of the substrate 161, annealing may be performed after adhering the carbon nanotube-based structure 131 to the substrate 161. In such case, since a carbide is formed at an interface of the substrate 161 and the carbon nanotube 105 by the annealing, the carbon nanotube-based structure 131 can be securely immobilized on a surface of the substrate 161.

Figure 3B:
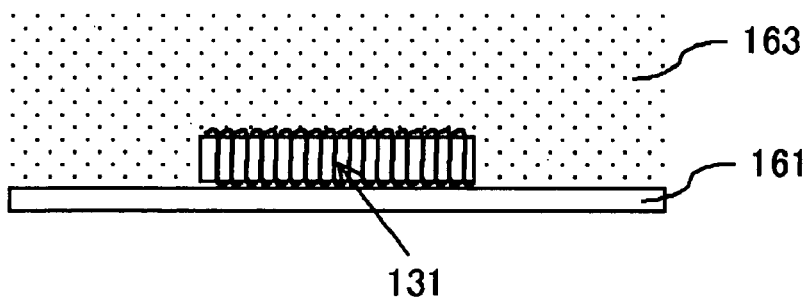

A buffer solution 163 is provided on a surface of the substrate 161 to which the carbon nanotube-based structure 131 is adhered (FIG. 3B). This can be achieved for example by dipping the substrate 161 in the buffer solution. A popularly known material, such as a phosphate buffer solution, may be used as the buffer solution 163 as long as it does not incur denaturation of the receptor 167 and the ligand 169.

Figure 3C:
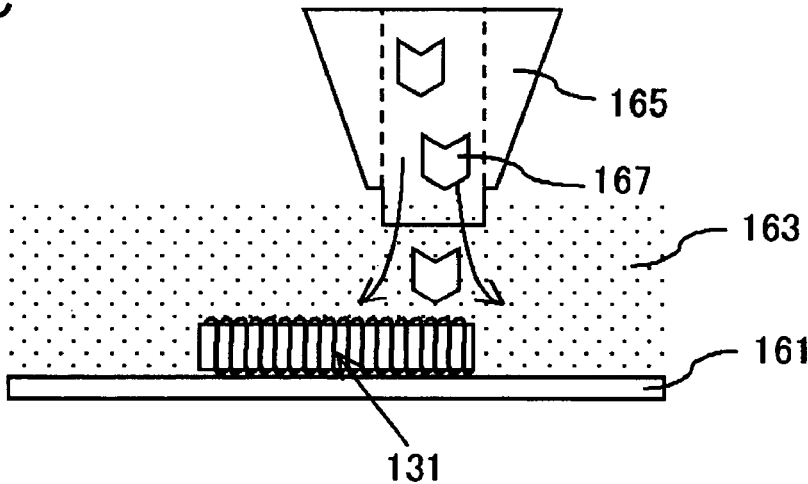

Then the receptor 167, constituted of a carboxyl group activated in advance with carbodiimide or the like, is bound to an amino group or the like of the polymer 119 on a rounded surface of the carbon nanotube-based structure 131. At this stage, the receptor 167 can be securely immobilized at a predetermined position of the carbon nanotube-based structure 131, through dispersing or dissolving the activated receptor 167 in a buffer solution and loading such solution in a nozzle 165 capable of injecting a droplet of a pico-liter level, for example a nozzle for an inkjet printer, and executing injection (FIG. 3C). Here, another condensation reagent may also be used for immobilization instead of the carbodiimide method.

Figure 3D:
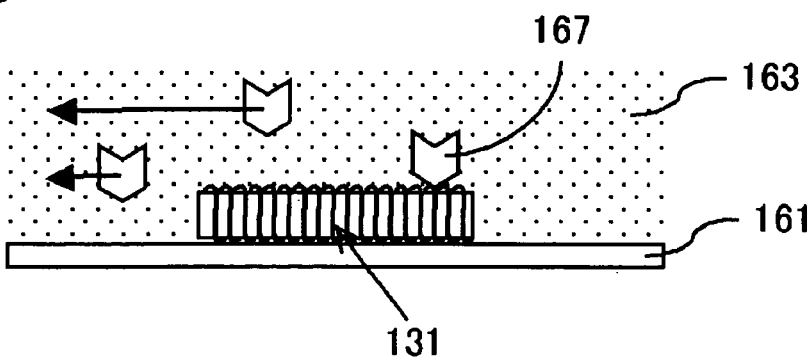

Thereafter, a surplus of the receptor 167 that has not been immobilized on the carbon nanotube-based structure 131 is washed away by flowing the buffer solution 163 (FIG. 3D).

Figure 4A:
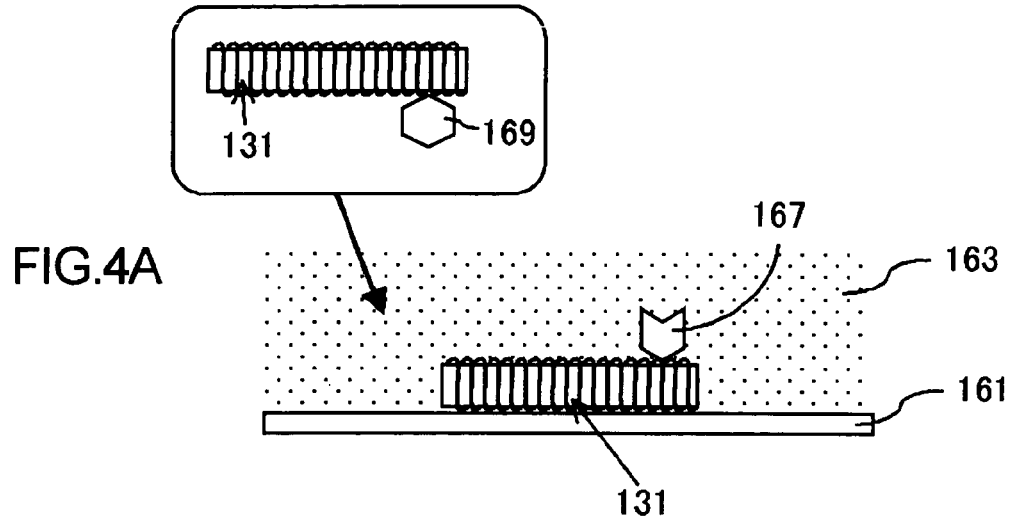
FIGS. 4A and 4B are explanatory cross-sectional drawings of another method of joining a carbon nanotube-based structure to a carbon nanotube via a ligand and a receptor, according to an embodiment.

In a similar process to the above, a carbon nanotube-based structure 131 having the ligand 169 immobilized at its rounded surface, as shown in the sub-section of FIG. 4A, is fabricated. At this stage, the ligand 169 may be immobilized in a similar manner after the carbon nanotube-based structure 131 is immobilized on the substrate (not shown), otherwise the carbon nanotube-based structure 131 may be collected after the step of FIG. 2E and suspension-concentrated together with the ligand 169 in the buffer solution, so that the ligand 169 becomes immobilized on the carbon nanotube-based structure 131. In this case, a surplus of the ligand 169 that has not bound to the carbon nanotube-based structure 131 may be removed by a centrifuging process.

Figure 4B:
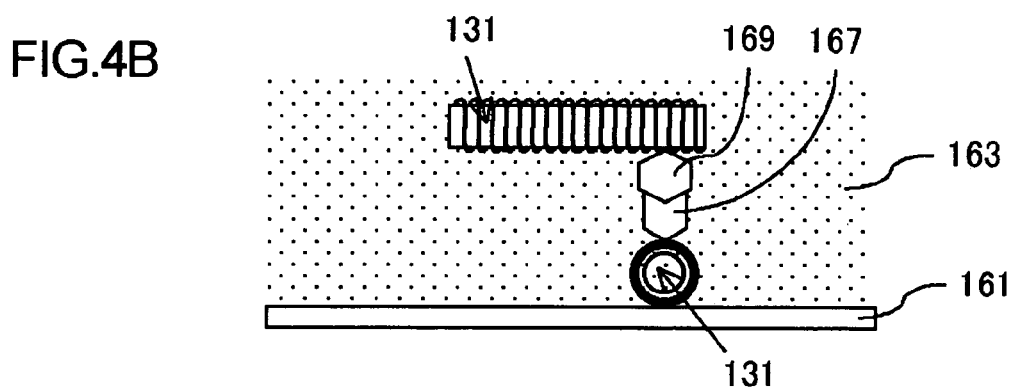

Now the carbon nanotube-based structure 131 immobilized receptor 167 is joined to and another carbon nanotube-based structure 131 immobilized ligand 169. Specifically, following the step of FIG. 3D the carbon nanotube-based structure 131 immobilized ligand 169 is added in the buffer solution 163 filled over the substrate 161 including the carbon nanotube-based structure 131 immobilized receptor 167 (FIG. 4A). At this stage it is preferable to leave the carbon nanotube-based structure 131 that has the ligand 169 dispersed in the buffer solution. Because of a specific interaction between the receptor 167 and the ligand 169 respectively immobilized on each carbon nanotube-based structure 131, the carbon nanotube-based structures 131 are joined to each other (FIG. 4B). In this way, a bonded structure constituted of the carbon nanotube-based structures 131, joined to each other at a predetermined position on the substrate 161 is obtained.

Meanwhile referring to the manufacturing process of the bonded structure of FIG. 1A, when immobilizing the receptor 167 to the carbon nanotube-based structure 131 also, the carbon nanotube-based structure 131 may be suspended in the buffer solution together with the receptor 167 for immobilizing the receptor 167 on the carbon nanotube-based structure 131 after the step of FIG. 2E, as the step of making up the carbon nanotube-based structure 131 having the immobilized ligand 169.

The bonded structure according to this embodiment can be suitably employed in an interconnect structure etc. of a nano-device. According to the foregoing process, it is possible to control a thickness, characteristics such as electric resistance, surface shape and surface characteristics etc. of the wrapping according to a molecular structure of the polymer 119.

Further, in this embodiment the receptor 167 or the ligand 169 may be bound to the carbon nanotube 105 constituting the carbon nanotube-based structure 131. In case, for example, where an end portion of the carbon nanotube 105 is carboxylized, the receptor 167 or the ligand 169 may be immobilized on the carboxyl group.

Furthermore, achieving precise control in bonding the carbon nanotube-based structure 131 at a desired position on the substrate 161 permits more stabilized manufacturing of a desired nano-device. For example, as will be described in the third embodiment, in case of introducing a thiol group to a predetermined position of the polymer 119 or the carbon nanotube 105 and employing the substrate 161 provided with a gold pad, the carbon nanotube-based structure 131 can be selectively bonded on a surface of the gold pad because of a specific interaction between the gold and the thiol group.

According to this embodiment, a tightly wrapping layer can be formed at least at a part of the surface of the carbon nanotube 105. Accordingly, additional surface characteristics can be provided to the carbon nanotube 105. For instance, a carbon nanotube-based structure 131 having excellent dispersion stability in water can be obtained. Also, by employing an insulative material as the polymer 119, a tight insulation layer can be formed on a surface of the carbon nanotube 105. A bonded structure provided with such carbon nanotube-based structure 131 can be preferably employed in an electronic device such as a transistor or a capacitor, in which the wrapping layer serves as a gate insulating film. Further, it is possible to utilize chemical modifiability of the polymer 119.

In this embodiment, in case of employing a multi-wall carbon nanotube as the carbon nanotube 105, for example a wrapping layer of a uniform thickness constituted of the polymer 119 can be formed on a surface of the carbon nanotube 105. Further, when utilizing a single-wall carbon nanotube, a wound layer of a predetermined pitch can be formed.

Also, in case of constituting the carbon nanotube-based structure 131 by winding the polymer 119 around a rounded surface of the carbon nanotube 105, the polymer 119 can remain stably adhered to the rounded surface of the carbon nanotube 105. Consequently, dispersion stability or preservation stability of the carbon nanotube-based structure 131 can be upgraded. Further, by employing an insulative material as the polymer 119, insulation level of the rounded surface of the carbon nanotube 105 can be improved.

The carbon nanotube-based structure 131 wound by the polymer 119 may be provided with a wrapping formed in a certain pitch on a rounded surface of the carbon nanotube 105. In this case a thickness of the wrapping can be selectively determined through a control in a formation process of the wrapping. By controlling the wrapping thickness in a range of, for example, 1 nm to 100 nm, electric surface characteristics of the carbon nanotube 105 can be accurately controlled. In case where the wrapping is a wound layer constituted of the polymer 119 wound around the carbon nanotube 105, the wound layer of the polymer 119 may be a single layer or multilayer.

Also, the carbon nanotube-based structure 131 according to this embodiment may be provided with a wrapping layer of a uniform thickness.

In the carbon nanotube-based structure 131 provided with a wrapping layer of a uniform thickness, the wrapping layer thickness may be 0.1 nm or more, preferably 1 nm or more. With such thickness level, surface characteristics of the carbon nanotube 105 can be accurately varied. Further, the wrapping layer thickness may be 10 nm or less, preferably 5 nm or less. With such thickness range, the wrapping layer can constitute a thin film. Accordingly, it becomes possible to improve dispersion stability of the carbon nanotube 105, without affecting the characteristic performance thereof. Also, a thin film can be efficiently formed on a surface of the carbon nanotube 105 with a minimal necessary amount of the polymer 119. Besides, in case of employing an insulative material as the polymer 119, a thin dielectric film that can serve as a tunnel layer can be stably formed on a rounded surface of the carbon nanotube 105. Consequently, such carbon nanotube-based structure 131 can be suitably applied to various electronic devices.

Meanwhile, in this embodiment the carbon nanotube-based structure 131 can also be manufactured in the following process. FIGS. 15A to 15E are explanatory drawings for explaining a manufacturing method of a carbon nanotube-based structure. Basically the foregoing process according to FIGS. 2A to 2E is applicable hereto, and a difference is that a dispersion 183 for the carbon nanotube 105 and a dispersion 185 for the polymer 119 are separately prepared, and that the dispersion 183 for the carbon nanotube 105 is first on the filled liquid 125 and the dispersion 185 for the polymer 119 is spread.

Figure 15A:
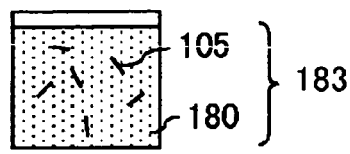
FIGS. 15A to 15E are explanatory drawings of a manufacturing method of a carbon nanotube-based structure according to an embodiment.
Figure 15B:
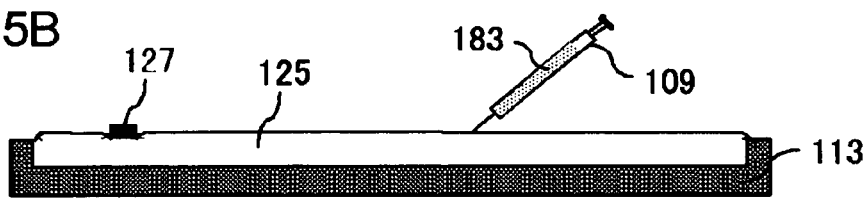

First, the carbon nanotube 105 is dispersed in a dispersion medium 180, to prepare the dispersion 183 (FIG. 15A). The dispersion medium 180 may be for example a DMF aqueous solution of 10 v/v % to 90 v/v % both inclusive, or a DMSO aqueous solution of 10 v/v % to 90 v/v % both inclusive. With such dispersion medium the carbon nanotube 105 can be thoroughly dispersed in the dispersion 183. Also, ultrasonic treatment may be applied during the dispersion process. The dispersion 183 is then on the filled liquid 125 (FIG. 15B).

Figure 15C:
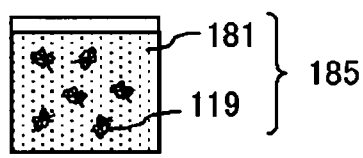

Secondly the polymer 119 is dispersed in a dispersion medium 181, to prepare the dispersion 185 (FIG. 15C). The dispersion medium 181 may be an organic solvent or an aqueous solution thereof that can disperse the polymer 119 in a reasonably stable manner. With such dispersion medium, when the dispersion 185 is on the filled liquid 125 a wrapping of the polymer 119 can be stably formed on a surface of the carbon nanotube 105 at a gas-liquid interface, as will be subsequently described.

Also, it is preferable that the dispersion medium 181 can disperse the carbon nanotube 105 in a reasonably stable manner. With such dispersion medium, formation of a wrapping of the polymer 119 on a rounded surface of each individual carbon nanotube 105 can be assured. The dispersion medium 181 can also be a solution that can be used as the dispersion medium 121 already described referring to FIGS. 2A to 2E. Also, an identical material may be used in common as the dispersion medium 180 and the dispersion medium 181.

Figure 15D:
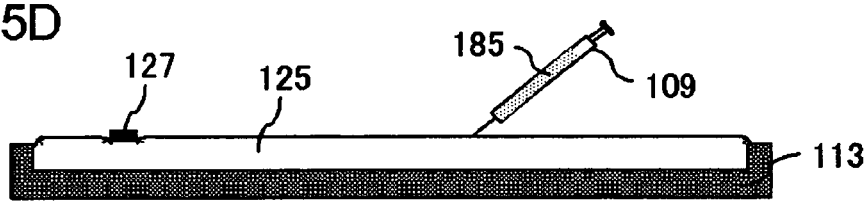
Figure 15E:
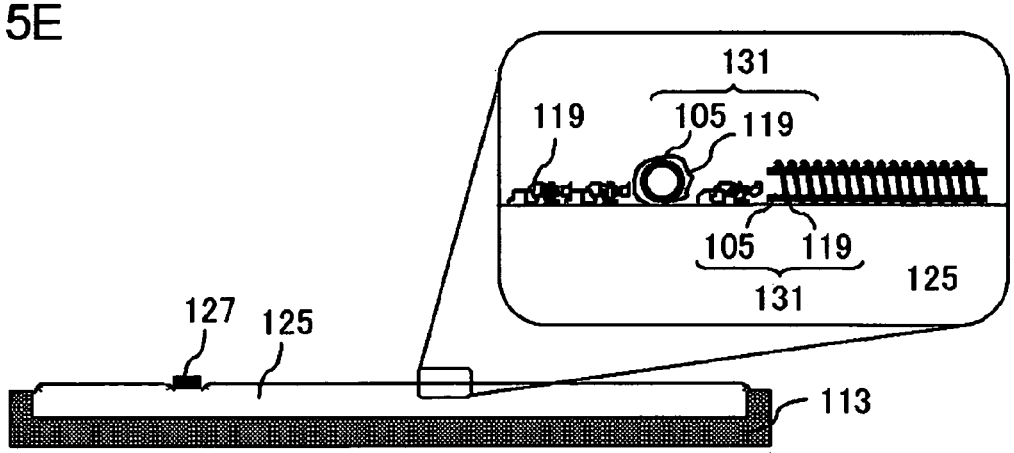

Now, the dispersion 185 prepared as above is on the filled liquid 125, on which the dispersion 183 has already been spread (FIG. 15D). Upon spreading the dispersion 185, the polymer 119 and the carbon nanotube 105 are blended, and resultantly the polymer 119 wraps a rounded surface of the carbon nanotube 105 thereby constituting the carbon nanotube-based structure 131 (FIG. 15E).

Accordingly, it is understood that even in case of spreading the dispersion 183 of the carbon nanotube 105 and the dispersion 185 of the polymer 119 over the filled liquid 125 at a different timing, the carbon nanotube-based structure 131 can be stably manufactured.

In case of employing a multi-wall carbon nanotube as the carbon nanotube 105 in the process of FIGS. 15A to 15E, a wrapping layer of the polymer 119 can be formed in a uniform thickness on a surface of the carbon nanotube 105. On the other hand, when utilizing a single-wall carbon nanotube, a wound wrapping of the polymer 119 can be formed in a predetermined pitch. In case of forming the wrapping by winding the polymer around the carbon nanotube 105 also, a wound layer of the polymer 119 wrapped on a rounded surface of the carbon nanotube 105 can be appropriately formed under certain conditions.

SECOND EMBODIMENT

Figure 1B:
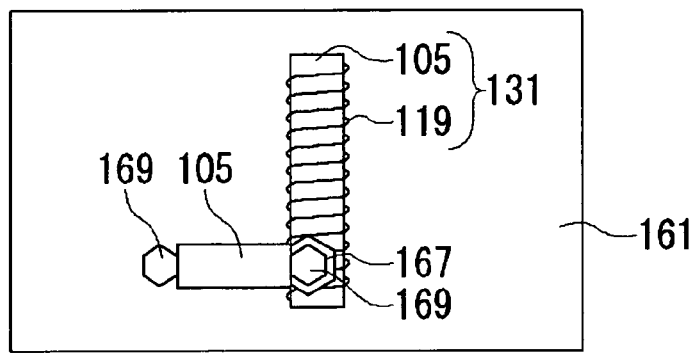

This embodiment relates to a bonded structure constituted of a carbon nanotube-based structure and a carbon nanotube not wrapped with a polymer joined to each other. FIG. 1B is a plan view showing a bonded structure according to this embodiment. A method of manufacturing the bonded structure shown in FIG. 1B will be described hereunder referring to FIGS. 2A through 3D and FIGS. 5A and 5B, focusing on aspects different from the first embodiment.

The receptor 167 is immobilized on the carbon nanotube-based structure 131 on the substrate 161 through the steps of FIGS. 2A through 3D as in the first embodiment (FIG. 3D).

Figure 5A:
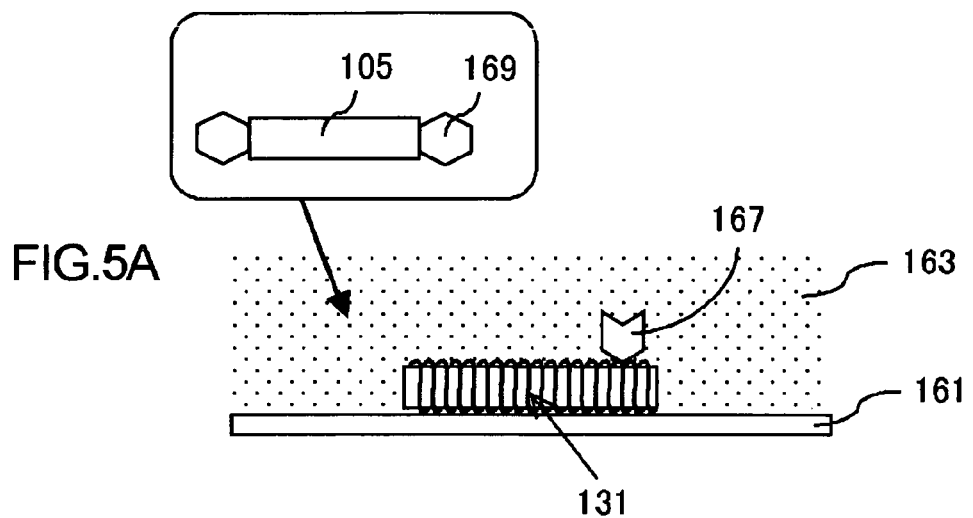
FIGS. 5A and 5B are explanatory cross-sectional drawings of still another method of joining a carbon nanotube-based structure to a carbon nanotube via a ligand and a receptor, according to an embodiment.
Figure 5B:
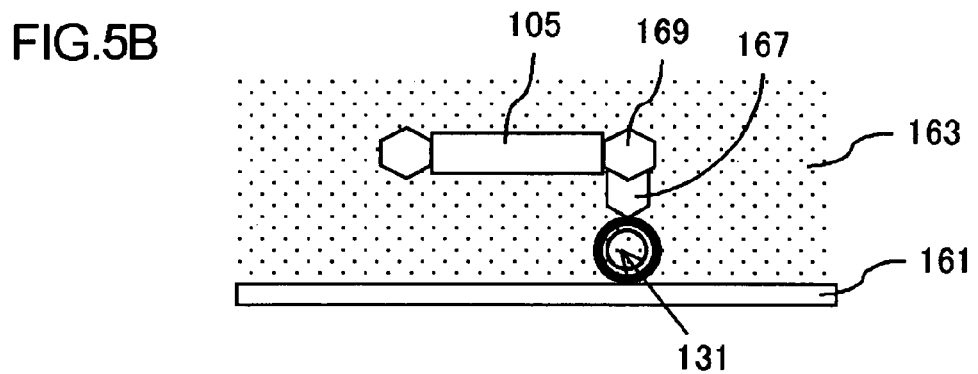

Then the carbon nanotube 105 having the ligand 169 immobilized thereon is added to the buffer solution 163 filled over the substrate 161 provided with the carbon nanotube-based structure 131 having the receptor 167 immobilized on the surface thereof (FIG. 5A). Because of a specific interaction between the receptor 167 immobilized on the carbon nanotube-based structure 131 and the ligand 169 immobilized on the carbon nanotube 105, the carbon nanotube-based structures 131 and the carbon nanotube 105 are joined to each other (FIG. 5B).

Meanwhile, the ligand 169 is immobilized on an end portion of the carbon nanotube 105 through the following process. The carbon nanotube 105 is cut so that a carboxyl group is introduced to an end portion of the carbon nanotube 105, in advance. For cutting the carbon nanotube 105, a known method may be employed such as a combination of acid treatment and ultrasonic treatment. Then the carboxyl group disposed at an end portion of the carbon nanotube 105 is activated through the carbodiimide method or the like, to thereby immobilize the amino group etc. of the ligand 169.

In this way the bonded structure constituted of the carbon nanotube-based structure 131 and the carbon nanotube 105 joined at a predetermined position on the substrate 161 is obtained. In this case, since the carbon nanotube-based structure 131 and the carbon nanotube 105 are provided, it is possible to join an end portion of the carbon nanotube 105 to a desired position on a rounded surface of the carbon nanotube-based structure 131.

In this embodiment also, the carbon nanotube-based structure 131 and the carbon nanotube 105 can be joined via a different combination that incurs a specific interaction, other than the combination of the receptor 167 and the ligand 169.

Figure 1C:
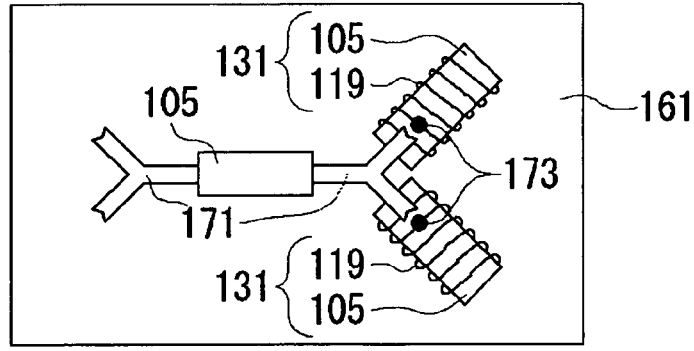
Figure 1D:
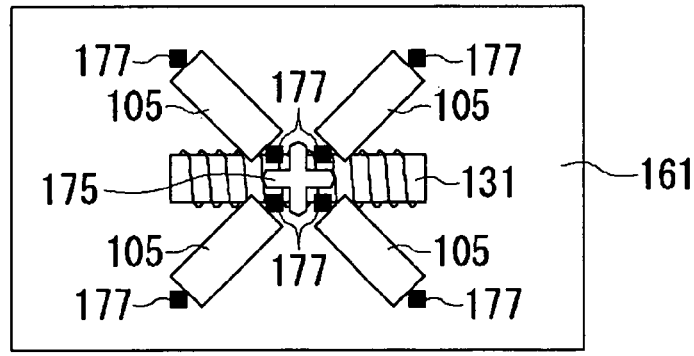

For example, FIG. 1C shows a constitution in which the carbon nanotubes 105 and the carbon nanotube-based structure 131 are joined via an antibody 171 and an antigen 173 instead of the combination of the receptor 167 and the ligand 169. Also, FIG. 1D shows a constitution in which the carbon nanotube-based structure 131 and the carbon nanotube 105 are joined via a specific interaction between an avidin 175 and a biotin 177. Accordingly, through selection among various options, it is possible to form a bonded structure having a complicated constitution including branched joint structures.

THIRD EMBODIMENT

Figure 7:
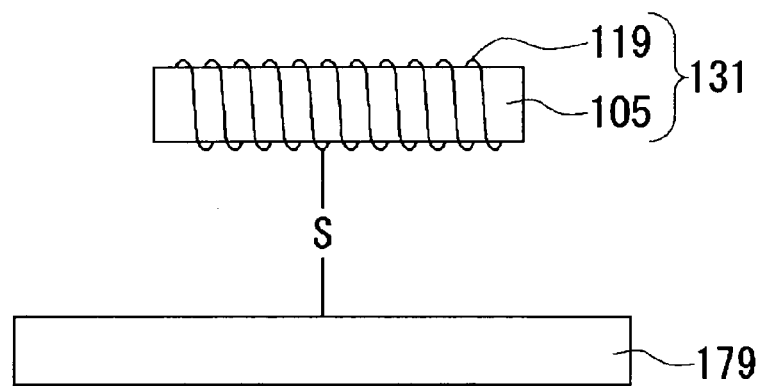
FIG. 7 is a schematic drawing of a bonded structure according to an embodiment.

This embodiment relates to a method of bonding a carbon nanotube-based structure on a substrate. FIG. 7 is a schematic drawing of a bonded structure according to this embodiment. In this drawing, the carbon nanotube-based structure 131 is selectively adsorbed on a surface of gold 179 provided on a base member (not shown in the drawings), via a thiol group included in the polymer 119.

In this embodiment, the polymer 119 is constituted of a substance described in the first embodiment, to which for example a thiol group is introduced. Otherwise, a polymer including a thiol group may be employed as it is. Referring to the base member, a material provided with for example the gold 179 on a part or an entirety of the surface thereof can be used. A material provided with the gold 179 can selectively adsorb the thiol group included in the polymer 119 to its surface.

The bonded structure of FIG. 7 is manufactured as follows. As in the first embodiment, the carbon nanotube-based structure 131, constituted of the carbon nanotube 105 wrapped with the polymer 119 on a rounded surface thereof, is adhered to a surface of the gold 179 on the base member by the horizontal transfer method. When wrapping the carbon nanotube 105 with the polymer 119, a reduction reagent such as DTT may be added to the dispersion medium 121 or to the filled liquid 125 of FIGS. 2A to 2E, as the case may be. Thereafter, upon washing the substrate surface with ethanol while applying ultrasonic vibration, the carbon nanotube-based structure 131 is disposed on a surface of the gold 179.

In this way, the carbon nanotube-based structure 131 can be selectively adsorbed on a region of the substrate where the gold 179 is provided, through simple steps. By the way, in this embodiment the thiol group is introduced to the polymer 119, while it is also possible to introduce the thiol group to an end portion of the carbon nanotube 105.

It is also possible to bond the gold 179 and the carbon nanotube-based structure 131 by adsorbing or binding a molecule having a thiol group or an amino group to a surface of the gold 179, so that the carboxyl group included in the carbon nanotube-based structure reacts with the thiol or amino group. Practically, first a molecule having a thiol group such as $HS-(CH_2)_n-NH_2$ (where n is a natural number) is adsorbed to a surface of the gold 179 to introduce an amino group. Then the carboxyl group disposed on the polymer 119 or at an end portion of the carbon nanotube 105 is activated by the carbodiimide method etc., and bonded to a surface of the gold 179 as described above. At this stage, in case where the molecule having the thiol group is adsorbed at a predetermined position on a surface of the gold 179, the carbon nanotube-based structure 131 can be selectively fixed at that position.

The method according to this embodiment is advantageous when manufacturing for example a transistor provided with an interconnection in which a carbon nanotube bonded structure is incorporated, because in case where a gold electrode is provided on a substrate the carbon nanotube-based structure 131 can be selectively bonded on the gold electrode. Accordingly, manufacturing process of the transistor can be simplified and performance stability can also be upgraded.

The bonded structure of the present invention has been described in detail referring to the foregoing embodiments. The bonded structure thus obtained is applicable to an extensive variety of purposes.

For instance, it is possible to dispose and bond the carbon nanotube-based structure at a desired position of a substrate or an electrode on an electronic device. In this case, as stated with respect to the first embodiment, since the carbon nanotube-based structure can be aligned in a certain direction, the orientation is also under control. Therefore, the carbon nanotube-based structure can be employed in a highly precise design.

Further, joining carbon nanotubes to one another or carbon nanotube-based structures to one another enables formation of various types of cubic nano-structures, therefore the carbon nanotube or the carbon nanotube-based structure is also applicable to a nano-circuit structure or a three-dimensional nano-interconnects.

FOURTH EMBODIMENT

Figure 12:
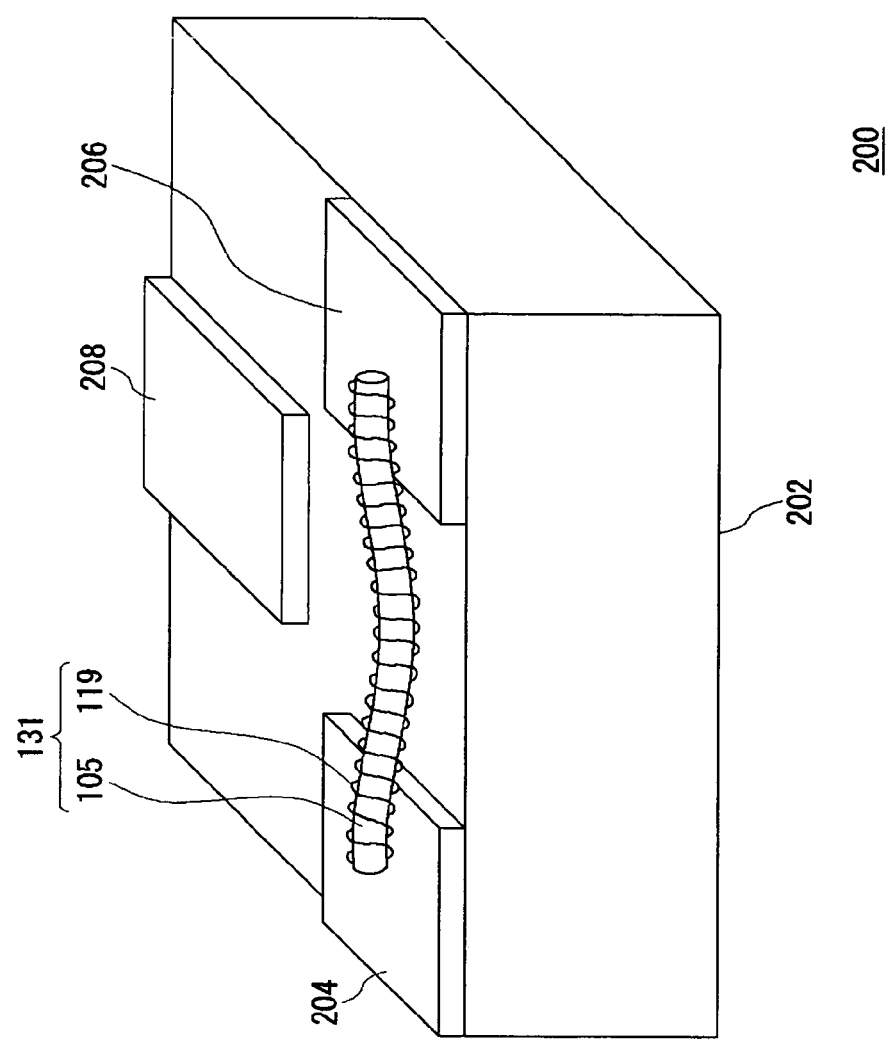
FIG. 12 is a schematic perspective view showing a constitution of a single electron transistor according to an embodiment.

FIG. 12 is a schematic perspective view showing a constitution of a single electron transistor 200 according to this embodiment. Referring to FIG. 12, a source electrode 204, a drain electrode 206 and a gate electrode 208 are disposed with a separation among one another on a silicon substrate 202. The carbon nanotube-based structure 131 is formed so as to span over the source electrode 204 and the drain electrode 206. The carbon nanotube-based structure 131 is constituted of a carbon nanotube 105 and the polymer 119 wrapping the surface thereof. The carbon nanotube-based structure 131 is fixed to the source electrode 204 and to the drain electrode 206 via the polymer 119. Here, a bonding material may be provided between the polymer 119 and either of the source electrode 204 and the drain electrode 206. In this embodiment, a single-wall carbon nanotube is preferably used for the carbon nanotube-based structure 131. As the polymer 119, a bacteriorhodopsin provided with a thiol group is preferably employed.

In this single electron transistor 200, the polymer 119 serves as a tunnel layer, while a portion of the carbon nanotube 105 laid between the source electrode 204 and the drain electrode 206 serves as a Coulomb island. In other words, an electron flows from the source electrode into the carbon nanotube 105 through the polymer 119, and flows out of the carbon nanotube 105 toward the drain electrode 206 through the polymer 119. A number of electrons that can exist in the carbon nanotube 105 is controlled, therefore a magnitude of drain current is controlled, according to a voltage applied to the gate electrode 208. This single electron transistor 200 permits performing a switching action with only several electrons, therefore power consumption can be dramatically reduced in comparison with a conventional MOSFET.

The single electron transistor 200 can be manufactured through the following process. Firstly, the source electrode 204, the drain electrode 206 and the gate electrode 208 are formed on the silicon substrate 202 by a known lithography and etching technique. The carbon nanotube-based structure 131 is then fabricated according to the method described in the third embodiment, and is selectively adhered to the source electrode 204 and the drain electrode 206 which are constituted of gold. In this way, the single electron transistor 200 shown in FIG. 12 can be obtained.

Length of the carbon nanotube: 100 to 1000 nm
Diameter of the carbon nanotube: 1 to 50 nm
Thickness of the polymer: 0.3 to 20 nm In designing a single electron transistor in general, a critical technical issue is how to reproducibly form a Coulomb island and a tunnel layer disposed between source/drain electrodes and the Coulomb island in dimensions sufficiently miniaturized for a quantum effect to appear. According to this embodiment, since the portion of the carbon nanotube 105 laid between the source electrode 204 and the drain electrode 206 itself constitutes the Coulomb island as it is, it is quite easy to design a size of the Coulomb island. Simply by determining an interval between the source electrode 204 and the drain electrode 206, a length of the Coulomb island is automatically determined at that length. Also, a diameter of the carbon nanotube 105 is at the same time a width of the Coulomb island, therefore the width of the Coulomb island can be precisely adjusted by appropriately controlling a manufacturing condition of the carbon nanotube. Further, a thickness of the tunnel layer can also be accurately controlled through appropriate selection of a type of the polymer 119 and setting of processing conditions when wrapping the carbon nanotube 105 with the polymer 119. Accordingly, the single electron transistor 200 of this embodiment can be manufactured in a stable precision level in compliance with designed dimensions. Consequently, the single electron transistor stably renders its desired performance based on a quantum effect.

Meanwhile, the technique of the etching and nano-imprinting may be adopted in this embodiment to miniaturize the size of Coulomb island to work more precisely as it is.

FIFTH EMBODIMENT

Figure 13:
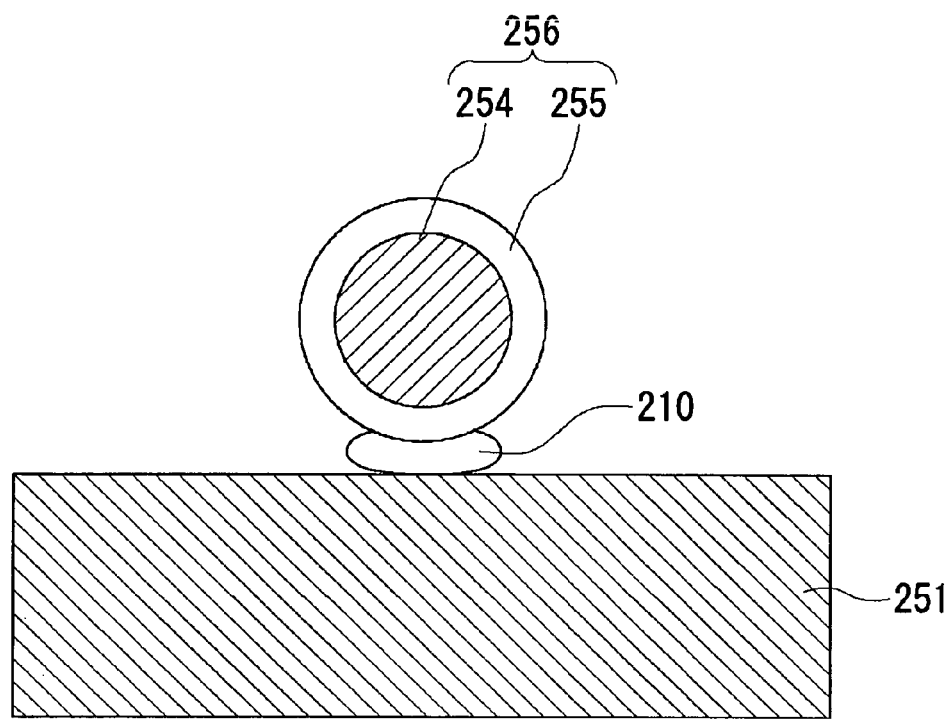
FIG. 13 is a schematic cross-sectional view showing a nano-capacitor according to an embodiment.

This embodiment relates to a miniaturized capacitor, which will be described hereunder referring to FIGS. 13 and 14. FIG. 13 is a schematic cross-sectional view showing a nano-capacitor according to this embodiment. This capacitor is provided with a carbon nanotube-based structure 256 constituted of a carbon nanotube 254 and a polymer 255, and a first electrode 251, bonded to each other via a bonding material 210. The bonding material 210 consists of a pair of a ligand and a receptor, one of which is immobilized on the polymer 255 and the other of which is immobilized on the first electrode 251.

The carbon nanotube 254 and the first electrode 251 are constituted of a highly conductive material, and respectively serving as an electrode of the capacitor. The polymer 255 serves as a capacitor film interleaved between these electrodes.

Figure 14:
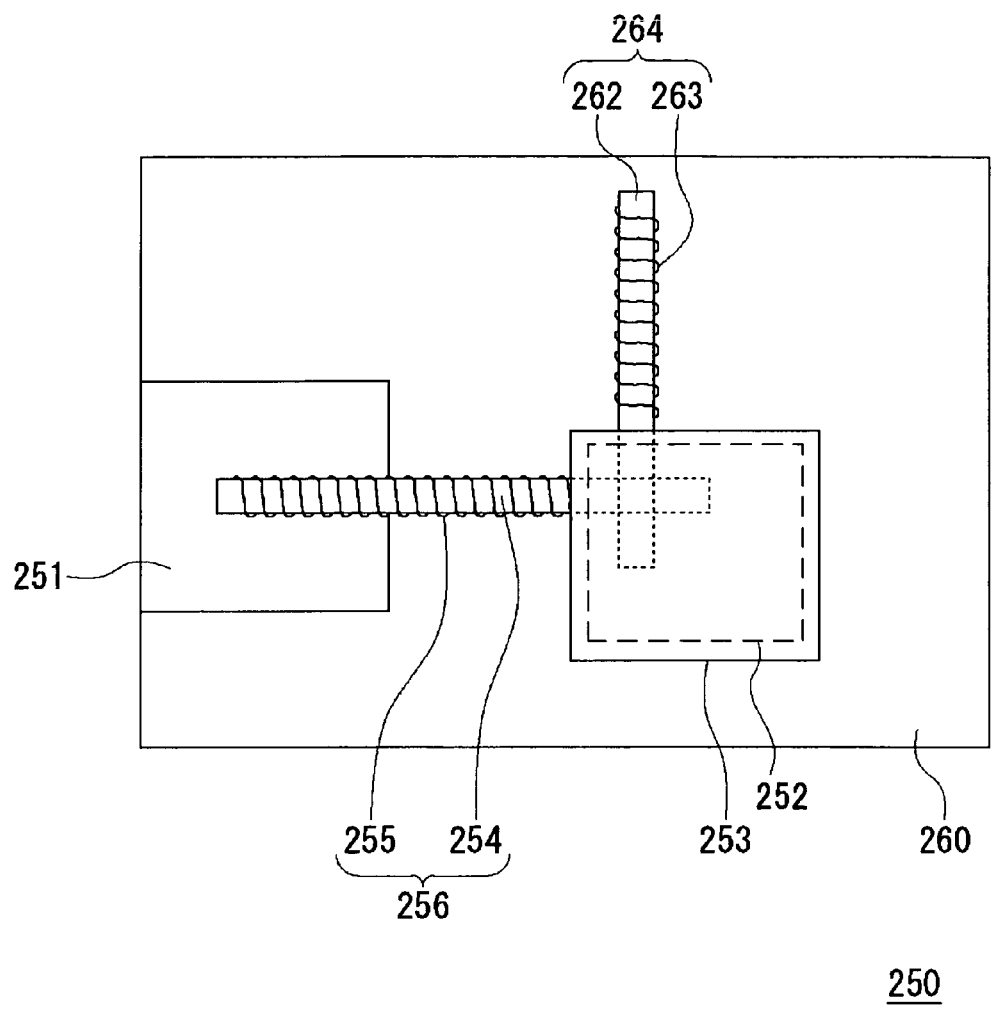
FIG. 14 is a schematic drawing showing the capacitor of FIG. 13 and a structure including an interconnection for supplying power to the capacitor.

Length of the carbon nanotube: 100 to 1000 nm
Diameter of the carbon nanotube: 1 to 100 nm
Thickness of the polymer: 0.3 to 50 nm FIG. 14 is a schematic plan view showing the capacitor of FIG. 13 and a structure 250 including an interconnection for supplying power to the capacitor. Referring to FIG. 14, the first electrode 251 and a second electrode 252 are provided on a silicon substrate 260. The carbon nanotube-based structure 256 constitutes a part of the above capacitor. Another carbon nanotube-based structure 264 is constituted of a carbon nanotube 262 and a polymer 263, and serving as a nano-interconnection for supplying power to the capacitor. The polymer 255 of the carbon nanotube-based structure 256 serves as a capacitor film, therefore is relatively thick. By contrast, since the polymer 263 of the carbon nanotube-based structure 264 is relatively thin, because it serves as an insulative coating layer of the interconnection.

These two carbon nanotube-based structures 256, 264 intersect at the respective end portion and are in direct contact with each other. At the contact point the polymers 255 and 263 are removed so that the carbon nanotubes 254 and 262 make direct contact with each other, achieving an ohmic contact. The intersection is covered with a metal pad 253 so that appropriate contact resistance can be attained. For making up such intersection, it is effective to first manufacture a bonded structure of the carbon nanotube-based structures and then molding the bonded portion with a metal material upon removing the polymer. In other words, after bonding the polymer 255 of the carbon nanotube-based structure 256 and the polymer 263 of the carbon nanotube-based structure 264 by an already described method such as utilizing a bonding material, the metal film is selectively deposited on the bonded portion. In this deposition process, the polymers 255, 263 can be removed by heat treatment etc.

The present invention has been described as above based on various embodiments. It is to be understood that these embodiments are only exemplary, and that it is apparent to those skilled in the art that various modifications can be made to constituents or process or a combination thereof, without departing from the scope and spirit of the present invention.

For instance, introducing a thiol group to a predetermined position of the polymer 119 permits formation of a bonded structure provided with the carbon nanotube-based structures 131 connected to each other without employing a bonding molecule such as a ligand and a receptor.

Figure 6:
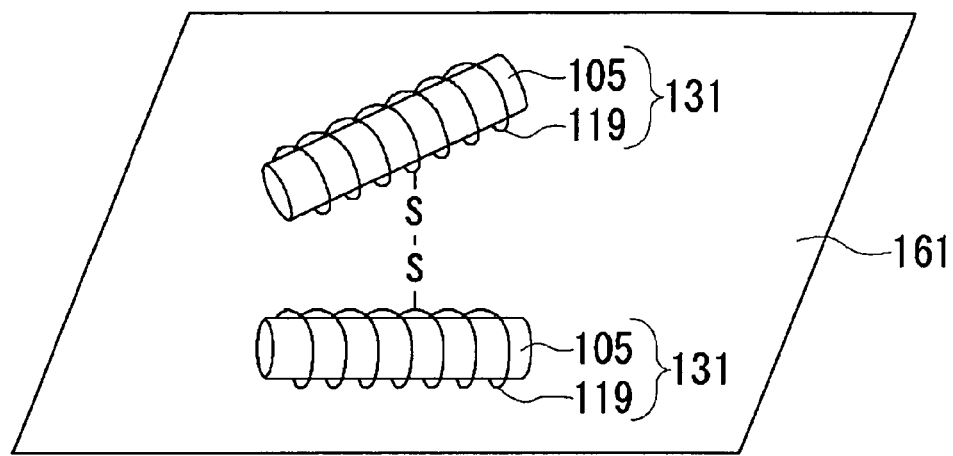
FIG. 6 is a schematic perspective view showing a bonded structure according to an embodiment.

FIG. 6 is a schematic perspective view showing a constitution of such bonded structure. As shown therein, two carbon nanotube-based structures 131 on the substrate 161 are bound in a disulfide bond between side chains of the respective polymers 119. The bonded structure of FIG. 6 has a simpler configuration and is therefore easier to manufacture, since the thiol group of the respective polymers 119 are bound to each other. Also, since a bonding molecule is not used, conductivity between the carbon nanotubes 105 in the individual carbon nanotube-based structures 131 can be fully secured. Further, while FIG. 6 shows two carbon nanotube-based structures joined to each other, a bonded structure constituted of three or more carbon nanotube-based structures can also be manufactured in a similar simplified manner.

WORKING EXAMPLE

Referring to this working example, firstly, making up of a carbon nanotube-based structure, which is a basic unit for constituting various bonded structures, was conducted.

FIGS. 8A to 8F are drawings showing a manufacturing method of a carbon nanotube-based structure. As shown therein, this working example represents a case of making up a carbon nanotube-based structure 117 including a carbon nanotube 105 wound by polypeptide chains of denatured bacteriorhodopsins 115.

Firstly, a purple membrane including a bacteriorhodopsin 101 was dispersed in a dispersion medium 103 (FIG. 8A). As the bacteriorhodopsin 101, for example either a purple membrane or a bacteriorhodopsin contained in the purple membrane may be employed, out of which the purple membrane was used in this working example. The purple membrane can be extracted from a halophilic bacteria such as *Halobacterium salinarum*. For extraction of the purple membrane, the method described in "Methods in Enzymology" 31, A, pp.667–678 (1974) was adopted. Also, 33 v/v % DMF (dimethylformamide) aqueous solution was used as the dispersion medium 103. By the way, an organic aqueous solution or the like may be used as the dispersion medium 103, without limiting to the 33 v/v % DMF aqueous solution.

An excessive amount of carbon nanotube 105 was added to the dispersion of the bacteriorhodopsin 101, and dispersion treatment was performed for more than an hour utilizing an ultrasonic disperser (FIG. 8B). After the dispersion process, aggregation of residual carbon nanotube 105 was removed. As the carbon nanotube 105, a single-wall carbon nanotube manufactured by CNI (Carbon Nanotechnologies Inc.) (open end type, approx. 1 nm in diameter and approx. 93% in purity) was employed.

The dispersion 107 thus obtained (FIG. 8C) was slowly on a surface of the filled liquid 111 contained in a bath with the syringe 109 (FIG. 8D). At this stage, a composite interface film consisting the carbon nanotubes 105 and bacteriorhodopsis 101 was obtained. Meanwhile, in this working example a Langmuir trough 113 was used as the bath, and pure water prepared at pH 3.5 with HCl was used as the filled liquid 111.

Then the composite interface film consisting the carbon nanotubes 105 and bacteriorhodopsis 101 was kept static so that interface denaturation of the bacteriorhodopsin 101 was incurred because of an interfacial tension of the filled liquid 111. In case of using the purple membrane, it is preferable to keep static for at least five hours at a room temperature in order to denature the entire bacteriorhodopsin in the purple membrane, therefore this step was continued five hours in this working example (FIG. 8E). Through this process, the denatured bacteriorhodopsin 115 winds around a rounded surface of the carbon nanotube 105 (FIG. 8F).

Figure 9:
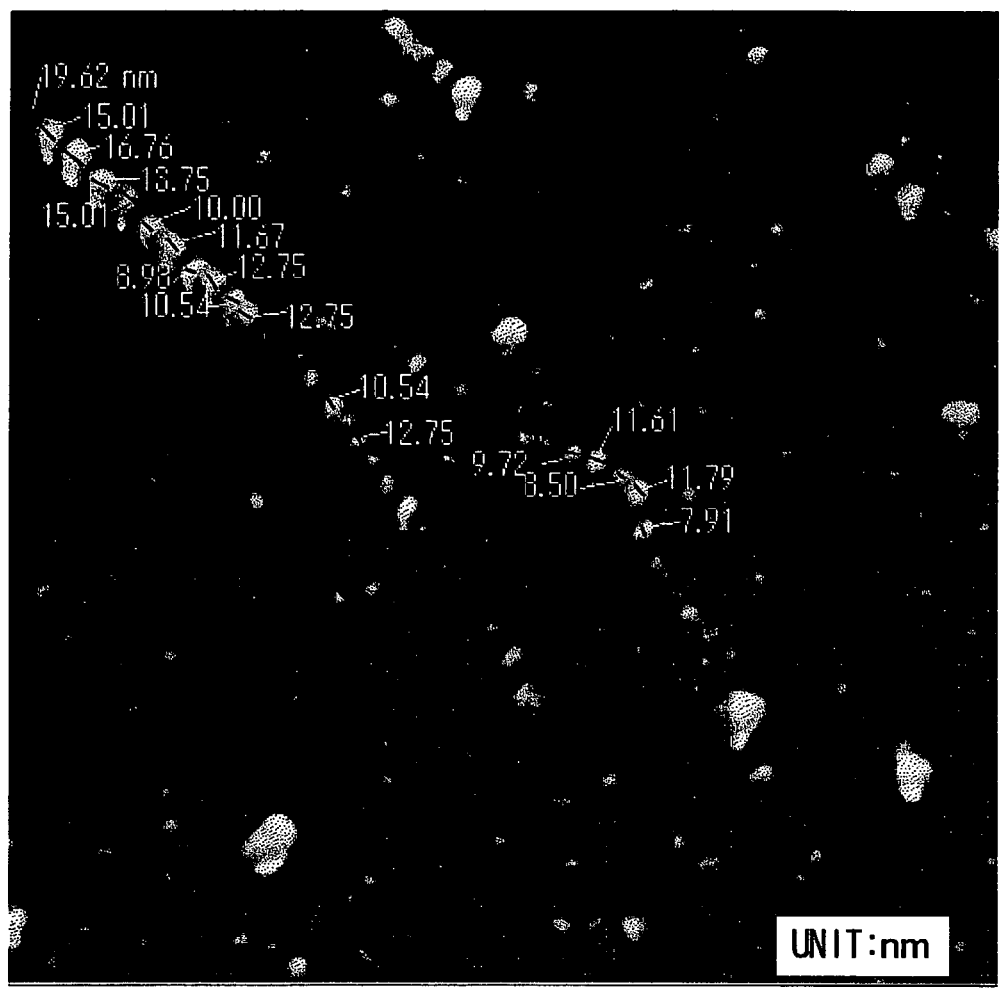
FIG. 9 shows an AFM image of a single-wall carbon nanotube-based structure according to a working example.
Figure 10:
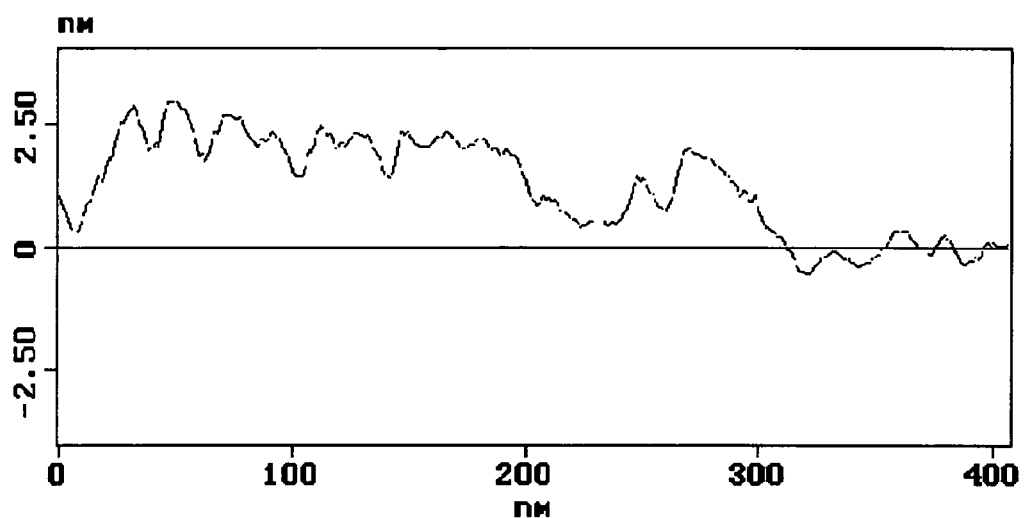
FIG. 10 shows a graph and an AFM image of a single-wall carbon nanotube-based structure according to a working example.
Figure 10:
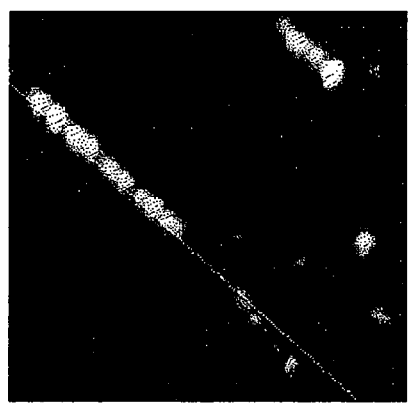
Figure 11:
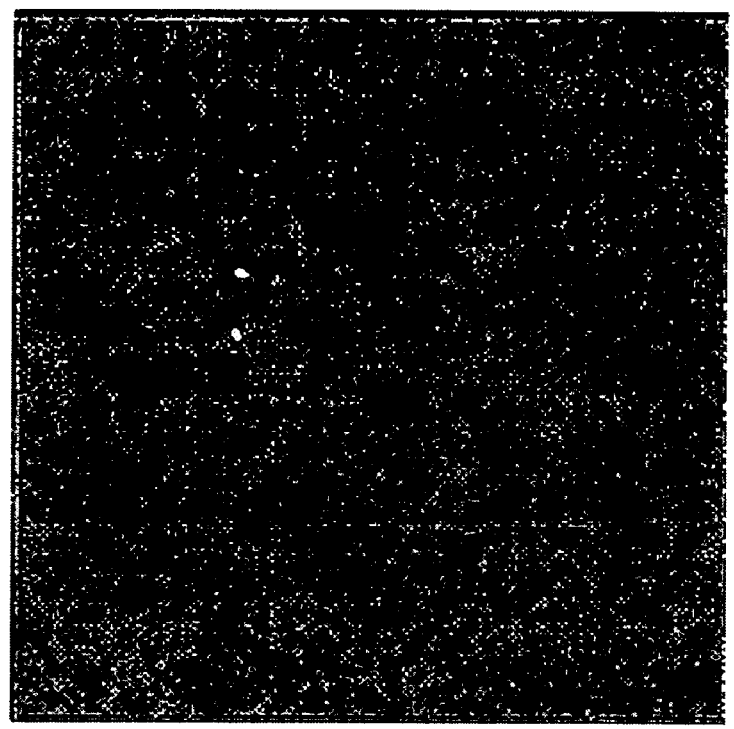
FIG. 11 shows an AFM image of a single-wall carbon nanotube-based structure according to another working example.
Figure 16:
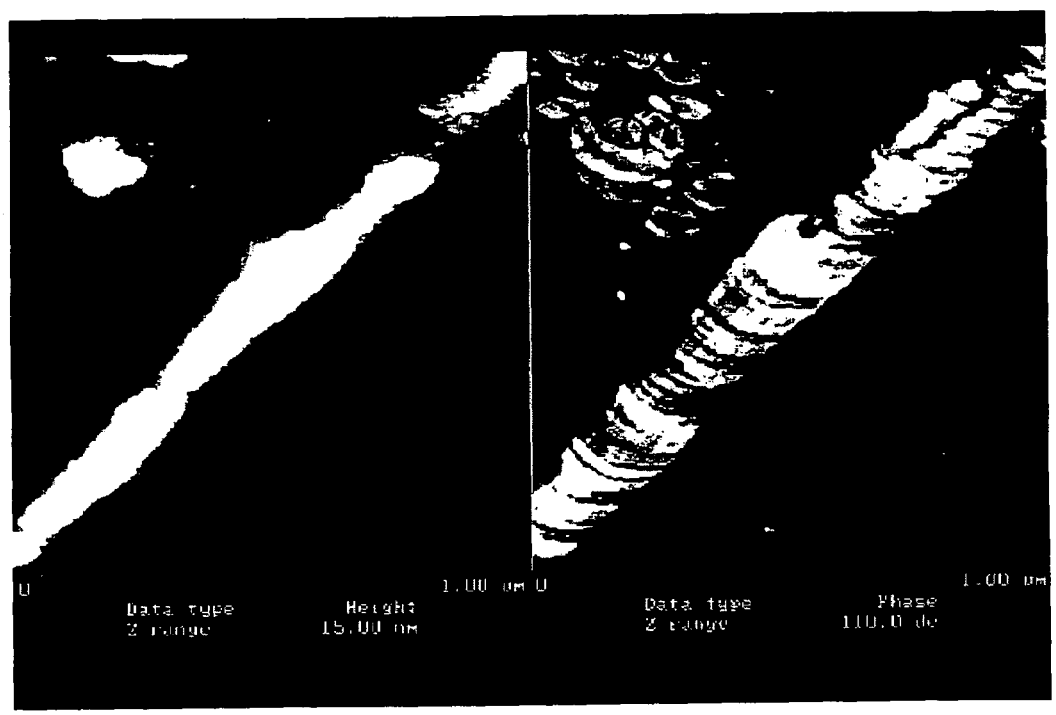
FIG. 16 shows AFM images of a single-wall carbon nanotube-based structure according to a working example.

The carbon nanotube-based structure 117 obtained as above was observed through an AFM and a TEM (transmission electron microscope). FIGS. 9, 10 and 16 respectively show an AFM image of the carbon nanotube-based structure 117. Also, FIG. 11 shows an AFM image of the carbon nanotube 105 that went through the same process but without the addition of the bacteriorhodopsin 101. For the AFM observation, a biomolecule visualizing and measuring instrument BMVM-X1 (modified from Nano Scope IIIa manufactured by Digital Instruments, Inc.) was employed. As a probe, AFM tip of monocrystalline silicon (NCH) was used. In FIGS. 9 to 11, the AFM measurement were set in the tapping mode, and the measuring range was set for 604 nm×604 nm (Z8 nm).

Upon comparing FIGS. 9, 10 and 16 with FIG. 11, it is understood, in view of FIGS. 9, 10 and 16, that ups and downs of a substantially constant pitch of approx. 20 nm are formed on the surface of the carbon nanotube 105 in case where the bacteriorhodopsin 101 was added. Also, in view of FIG. 10 it is understood that a height gap between a peak and a bottom of the ups and downs on the surface, i.e. a thickness of the wrapping is generally uniform. Accordingly, it is proven that because of the denatured bacteriorhodopsin 115 being wound around the surface of the carbon nanotube 105 a wrapping layer of a substantially uniform thickness has been formed on the surface of the carbon nanotube 105. On the other hand, as a result of observing in the same way the carbon nanotube 105 alone shown in FIG. 11, such ups and downs are not observed on its surface. Accordingly, it is proven that the denatured bacteriorhodopsin 115 is wound around the surface of the carbon nanotube 105.

Figure 17:
FIG. 17 shows a TEM image of a single-wall carbon nanotube-based structure according to a working example.

Further, the carbon nanotube-based structure 117 formed on the water surface was transferred onto a TEM grid together with the supporting interface film, and was observed as it was through the TEM after drying. FIG. 17 shows a TEM image of the carbon nanotube-based structure 117. As shown in FIG. 17, a tightly wound layer of the denatured bacteriorhodopsin 115 that has a supposed pitch was formed on the surface of the carbon nanotube 105.

As described above, in this working example the carbon nanotube-based structure 117 was obtained through a simple process of dispersing the bacteriorhodopsin 101 and the carbon nanotube 105 and spreading over a liquid surface. Utilizing the carbon nanotube-based structure 117 thus obtained permits formation of a bonded structure of a desired constitution.

Figure 18:
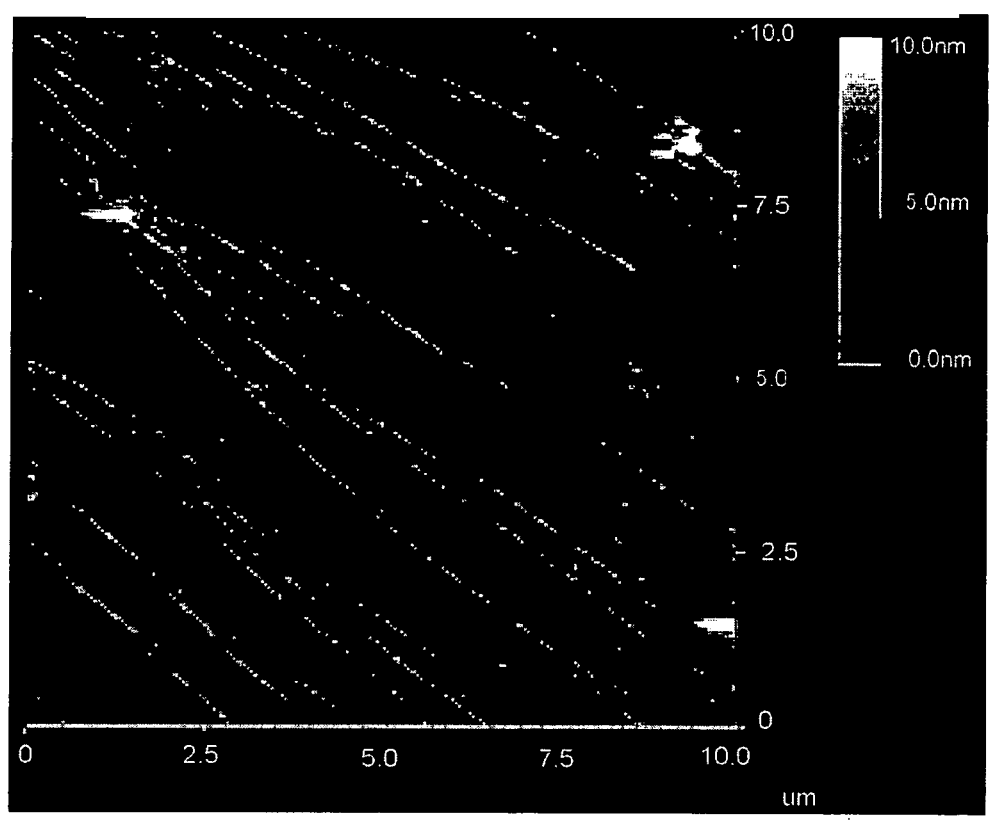
FIG. 18 shows an AFM image of a multi-wall carbon nanotube-based structure according to a working example.
Figure 19:
FIG. 19 shows a TEM image of a multi-wall carbon nanotube-based structure according to a working example.

Also, another carbon nanotube-based structure 117 was fabricated in the same way as shown in FIGS. 8A to 8F, but using a multi-wall carbon nanotube manufactured by MTR Ltd. (closed end type, several dozen to 200 nm in diameter and approx. 95% in purity) as the carbon nanotube 105. Upon making up, the obtained carbon nanotube-based structure 117 was observed through an AFM and a TEM. FIG. 18 shows an AFM image of the carbon nanotube-based structure 117 made from the multi-wall carbon nanotube. Also, FIG. 19 shows a TEM image of the carbon nanotube-based structure 117 made from the multi-wall carbon nanotube.

Referring to FIG. 18, also in case where the multi-wall carbon nanotube was used as the carbon nanotube 105, an alignment layer in which the carbon nanotube-based structure 117 is aligned generally in parallel. Also, as a result of observing the carbon nanotube-based structure 117 formed on the water surface through the TEM upon transferring onto the TEM grid together with the supporting interface film and after drying, a layer of the denatured bacteriorhodopsin 115 of a substantially uniform thickness was formed on the surface of the carbon nanotube 105, as shown in FIG. 19. Thickness of the denatured bacteriorhodopsin layer was approx. 3 nm.

Accordingly, as a result of utilizing the bacteriorhodopsin, which is a membrane protein, the carbon nanotube-based structure 117 that offers excellent manufacturing stability has been obtained. Also, in this working example, utilizing the purple membrane in which a lipid membrane having an amphiphilic structure is coordinated around the bacteriorhodopsin has resulted in stable manufacturing of the carbon nanotube-based structure 117.

Further, fabrication of still another carbon nanotube-based structure 117 was attempted utilizing a histone protein isolated from calves as the polymer 119, instead of the bacteriorhodopsin 101. However, a interface film of the histone protein was not satisfactorily formed on the filled liquid 111, and therefore it was impossible to form a wrapping layer of the histone protein on the surface of the carbon nanotube 105.

Also, another attempt was made for fabricating the carbon nanotube-based structure 117 through the process of FIGS. 15A to 15E instead of the process of FIGS. 8A to 8F. In this attempt, 33 v/v % DMF (dimethylformamide) aqueous solution was used as the dispersion medium 180 and 181 of FIGS. 15A and 15C. As the filled liquid 125, pure water adjusted at pH3.5 with HCl was used.

As a result, in either cases where the single-wall carbon nanotube or the multi-wall carbon nanotube was used as the carbon nanotube 105, the carbon nanotube-based structure 117 provided with a wrapping of the denatured bacteriorhodopsin 115 formed on the surface of the carbon nanotube 105 was stably obtained. In addition, the carbon nanotube-based structure 117 thus obtained showed excellent dispersion stability.

On the other hand, as a result of firstly spreading the dispersion 185 over the filled liquid 125 and secondly the dispersion 183 contrarily to the process of FIGS. 15A to 15E, the carbon nanotube-based structure 117 could not be obtained.

Accordingly, by adding the bacteriorhodopsin 101 after disposing first the carbon nanotube 105 in the proximity of the gas-liquid interface, the bacteriorhodopsin 101 can be denatured at the interface so that its hydrophobic portion is exposed, and resultantly the carbon nanotube 105 can be covered by the denatured bacteriorhodopsin 115 through a hydrophobic interaction between the denatured bacteriorhodopsin 115 and the surface of the carbon nanotube 105.

Further, with the working examples, bonding of the obtained carbon nanotube-based structure 117 on a glass substrate, as well as biotinylation and avidination of the surface of the bonded carbon nanotube-based structure 117 was conducted.

Using the MWCNT as the carbon nanotube 105, the carbon nanotube-based structure 117 was fabricated according to the process of FIGS. 8A to 8F. Accordingly, as already described referring to FIGS. 8A to 8F, a interface film including the carbon nanotube 105 provided with the denatured bacteriorhodopsin 115 wrapping its rounded surface, i.e. of the carbon nanotube-based structure 117 is formed on the filled liquid 111.

The interface film including this carbon nanotube-based structure 117 was then transferred to a surface of a slide glass. FIGS. 20A to 20D and 21A to 21D are explanatory drawings for explaining a fabrication process of the carbon nanotube-based structure transferred substrate prepared prior to biotinylation, in this working example. FIGS. 21A to 21D are cross-sectional views taken along the line A–A' of FIGS. 20A to 20D respectively.

Figure 20A:
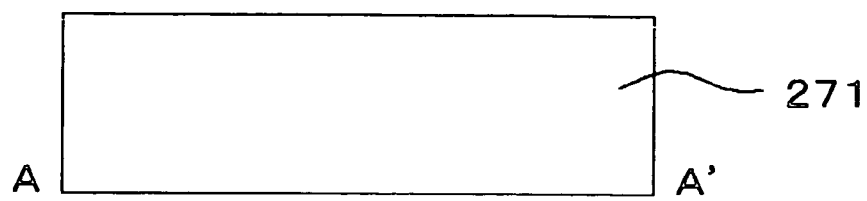
FIGS. 20A to 20D are explanatory drawings of preliminary steps for avidination of a carbon nanotube-based structure transfer surface according to a working example.
Figure 20B:
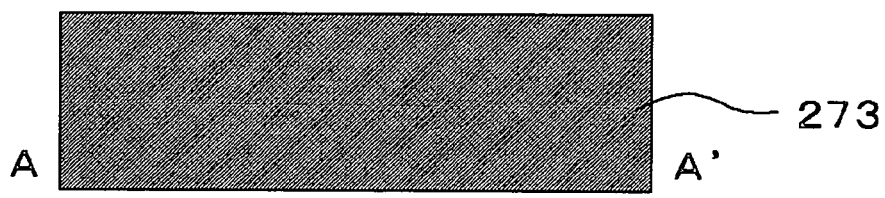
Figure 21A:
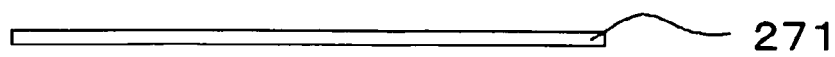
FIGS. 21A to 21D are explanatory drawings of preliminary steps for avidination of a carbon nanotube-based structure transfer surface according to a working example.
Figure 21B:
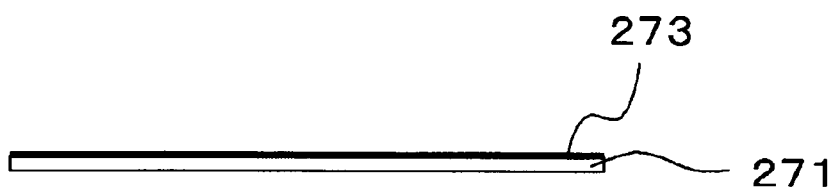

First, a slide glass 271 was prepared as a substrate (FIGS. 20A and 21A), and the interface film including the carbon nanotube-based structure 117 was adhered to a surface of the slide glass 271 by the horizontal transfer method, thus to constitute a carbon nanotube-based structure transfer surface 273 (FIGS. 20B and 21B). The interface film including the carbon nanotube-based structure 117 was firmly adhered to the surface of the slide glass 271 without flowing off because of an operation to be subsequently described.

Figure 20C:
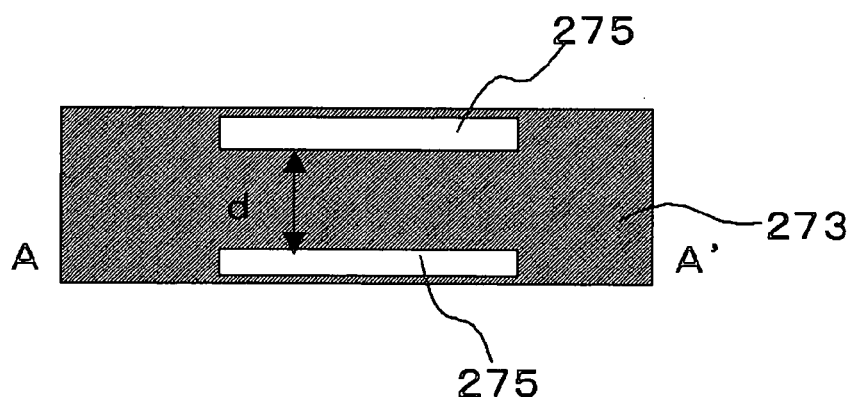
Figure 20D:
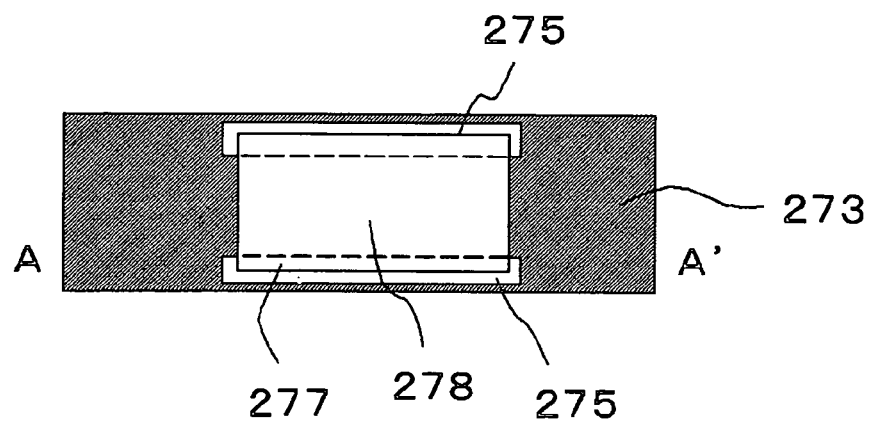
Figure 21C:
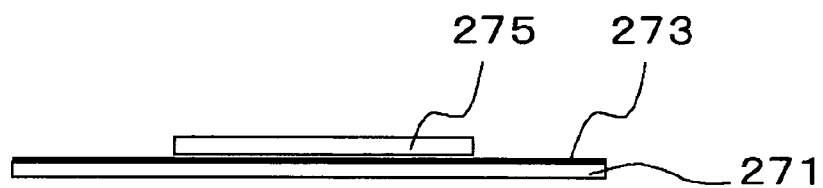
Figure 21D:
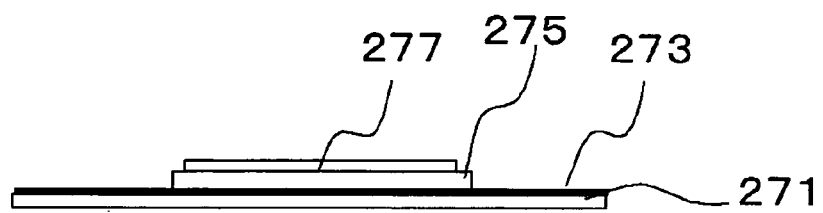

Then two spacers 275, were disposed generally in parallel to each other on the carbon nanotube-based structure transfer surface 273 (FIGS. 20C and 21C). The spacers 275 were disposed along a longitudinal edge of the slide glass 271 in a longitudinal direction thereof. Further, a cover glass 277 was placed over the two spacers 275 (FIGS. 20D and 21D). At this stage, a gap 278 of a height equivalent to a thickness of the spacers 275 was defined between the carbon nanotube-based structure transfer surface 273 and the cover glass 277. The width d of the gap 278 defined between the spacers 275 was set at approx. 1 cm.

Thereafter, the following reagents were sequentially introduced into the gap 278 for biotinylation of the carbon nanotube-based structure transfer surface 273, after which the surface of the carbon nanotube-based structure 117 was avidinated via the biotin.

The reagents used for the biotinylation and avidination are the following: 1.24 ml of DMSO was added to 1.1 mg of Biotin-AC$_5$-OSu (manufactured by Dojindo Molecular Technologies, Inc.) to give 1.95 mM of biotin-DMSO solution. 950 ìl of pure water was added to 50 ìl of the biotin-DMSO solution, to give 0.0976 mM of biotin solution. The biotin solution thus obtained was designated as liquid A (apparox. 0.1 mM of biotin solution). 0.09 mg of fluorescent dye conjugated avidin (Avidun, Alexa Flour 488 conjugate: manufactured by Molecular Probes, Inc.) was dissolved in 900 ìL of 0.5M sodium phosphate buffer (pH 7.1), which was designated as liquid B.

FIGS. 22A to 22F and 23A to 23C are explanatory drawings for explaining biotinylation steps of the carbon nanotube-based structure transfer surface 273.

Figure 22A:
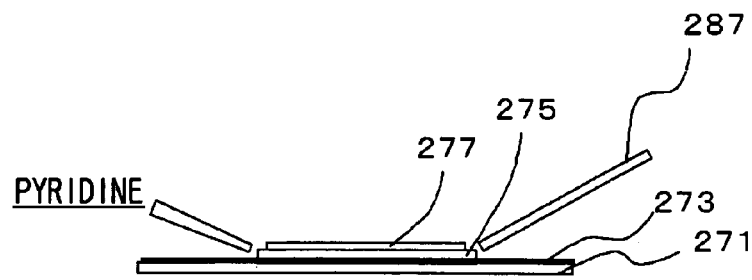
FIGS. 22A to 22F are explanatory drawings of avidination steps of a carbon nanotube-based structure transfer surface according to a working example.

First, pyridine was dropped on an end portion of the gap 278 between the carbon nanotube-based structure transfer surface 273 and the cover glass 277, to activate a lysine residue in the denatured bacteriorhodopsin 115. Then the pyridine promptly flowed into the gap 278 because of a capillary effect, and was absorbed by a filter paper at the other end portion of the gap 278 (FIG. 22A). Thereafter pure water was introduced into the gap 278 through an end portion thereof and absorbed by a filter paper at the other end portion, and such operation was repeated several times.

Figure 22B:
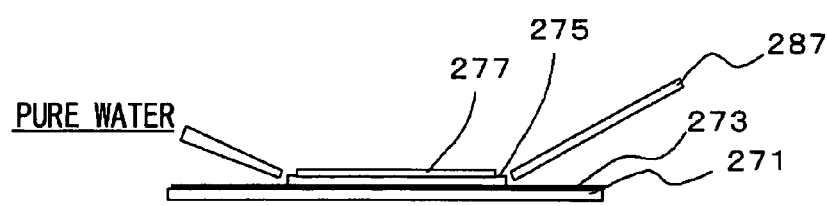

FIG. 23A schematically shows a part of a cross-sectional view of the carbon nanotube-based structure 117 under the state of FIG. 22B. FIG. 23A shows a state wherein a wrapping of the denatured bacteriorhodopsin 115 is formed on the surface of the MWCNT 279. By the way, a molecule of the denatured bacteriorhodopsin 115 has 248 pieces of amino-acid residues, out of which seven are lysine residues 281.

Figure 22C:
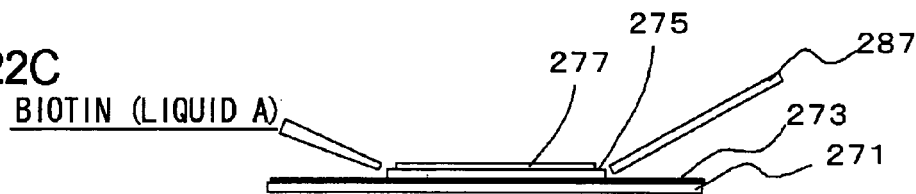
Figure 22D:
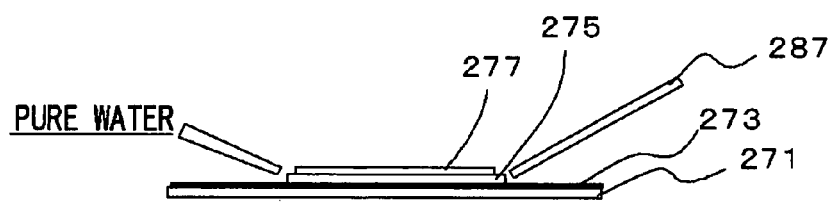

Then the liquid A was introduced into the gap 278 through an end portion thereof and was absorbed by a filter paper at the other end portion thereof (FIG. 22C). Then pure water was introduced into the gap 278 in the same way as FIG. 22B to clean the surface of the carbon nanotube-based structure transfer surface 273 (FIG. 22D). FIG. 23B schematically shows a part of a cross-sectional view of the carbon nanotube-based structure 117 under the state of FIG. 22D. The biotin 283 used in this working example is activated by succinimide, therefore the biotin 283 is immobilized to the lysine residue 281 of the denatured bacteriorhodopsin 115, as shown in FIG. 23B.

Figure 22E:
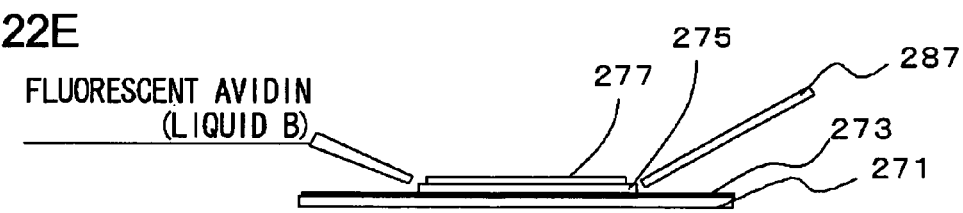

Thereafter, 100 ìL of the liquid B was introduced into the gap 278 through an end portion thereof and was absorbed by a filter paper at the other end portion thereof (FIG. 22E).

Figure 22F:
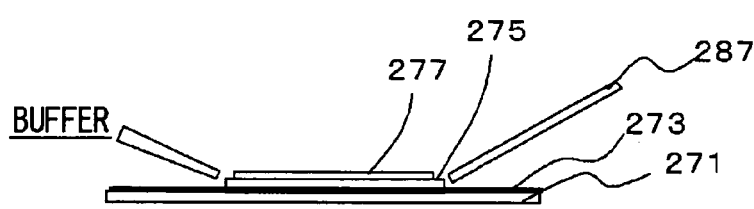

Then 100 ìL of the buffer was introduced into the gap 278 six times to clean the surface of the carbon nanotube-based structure transfer surface 273 with the buffer in the same way as FIG. 22B, after which the gap 278 was filled with the buffer (FIG. 22F). FIG. 23C schematically shows a part of a cross-sectional view of the carbon nanotube-based structure 117 under the state of FIG. 22F. Because of a specific interaction between the biotin 283 and the avidin 285, the surface of the carbon nanotube-based structure 117 is avidinated via the biotin 283.

The surface of the carbon nanotube-based structure transfer surface 273 avidinated as above was observed through a fluorescent microscope. The observation was performed disposing the side of the cover glass 277 applied to the oil immersion lens of the fluorescent microscope.

FIG. 24 shows a fluorescent microscopic image of the carbon nanotube-based structure transfer surface 273 avidinated via the biotin 283. As shown in FIG. 24, the surface of the cord-shaped MWCNT 279 was prominently illuminating against the background. The surface of the MWCNT 279 was emitting reddish green light.

On the other hand, the same biotinylation and fluorescent dye conjugated avidination was performed on the surface of the slide glass 271 to which the carbon nanotube-based structure 117 was not adhered. As a result of the observation of such slide glass 271 through the fluorescent microscope, the entire visual field was uniformly emitting dim green light.

Meanwhile, a maximal value of the absorbance wavelength of the fluorescent dye conjugated avidin used in this working example was approx. 495 nm, and a maximal value of the fluorescent wavelength was approx. 519 nm.

In view of FIG. 24 it is proven that, on the carbon nanotube-based structure transfer surface 273 to which the carbon nanotube-based structure 117 is adhered, the denatured bacteriorhodopsin 115 is tightly covering the surface of the MWCNT 279 constituting the carbon nanotube-based structure 117 based on the reddish green light prominently illuminating against the background, because such light is emitted as a result of condensation of the avidin 285 caused by the tightly wrapped layer.

Also, it has proven possible to stably biotinylate the surface of the wrapping layer of the MWCNT 279, and to thereby stably avidinate the surface of the wrapping layer through a specific interaction between the biotin 283 and the avidin 285.

As described above, in this working example a carbon nanotube bonded structure wherein the carbon nanotube-based structure 117 is tightly adhered to the surface of the glass substrate has been successfully fabricated. Also, the surface of the adhered carbon nanotube-based structure 117 could be biotinylated, and then the surface of the carbon nanotube-based structure 117 could be avidinated via the biotin 283.

Further, according to the process employed in this working example, it becomes possible to form the carbon nanotube bonded structures having various other shapes or constitutions, by binding the avidin 285 to other structures.

What is claimed is:

1. A bonded structure comprising:
   a first structure which is a carbon nanotube-based structure including a carbon nanotube and a polymer layer wrapping a rounded surface thereof;
   a second structure bonded with said carbon nanotube-based structure; and a bonding material between said polymer and said second structure to be bonded therewith, wherein said carbon nanotube-based structure and said second structure are bonded via said polymer, wherein said bonding material comprises a set of molecules with a specific interaction, and wherein said set of molecules with a specific interaction includes a combination of a ligand and a receptor, or a combination of an antigen and an antibody.

2. A bonded structure comprising:

a first structure which is a carbon nanotube-based structure including a carbon nanotube and a polymer wound around a rounded surface thereof;

a second structure bonded with said carbon nanotube-based structure; and a bonding material between said polymer and said second structure to be bonded therewith, wherein said carbon nanotube-based structure and said second structure are bonded via said polymer, wherein said bonding material comprises a set of molecules with a specific interaction, and wherein said set of molecules with a specific interaction includes a combination of a ligand and a receptor, or a combination of an antigen and an antibody.

3. A bonded structure comprising:

a first structure which is a carbon nanotube-based structure including a carbon nanotube and a polymer layer wrapping a rounded surface thereof; and a second structure bonded with said carbon nanotube-based structure, wherein said polymer includes a polypeptide.

4. A bonded structure comprising:

a first structure which is a carbon nanotube-based structure including a carbon nanotube and a polymer wound around a rounded surface thereof; and a second structure bonded with said carbon nanotube-based structure, wherein said polymer includes a polypeptide.

5. A bonded structure comprising:

a first structure which is a carbon nanotube-based structure including a carbon nanotube and a polymer layer wrapping a rounded surface thereof; and a second structure bonded with said carbon nanotube-based structure, wherein said second structure is a metal film.

6. A bonded structure comprising:

a first structure which is a carbon nanotube-based structure including a carbon nanotube and a polymer wound around a rounded surface thereof; and a second structure bonded with said carbon nanotube-based structure, wherein said second structure is a metal film.

* * * * *